(12) United States Patent
Nakamura

(10) Patent No.: US 9,660,356 B1
(45) Date of Patent: May 23, 2017

(54) SEMICONDUCTOR DEVICE

(71) Applicant: FUJI ELECTRIC CO., LTD., Kawasaki-shi, Kanagawa (JP)

(72) Inventor: Hideyo Nakamura, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/282,240

(22) Filed: Sep. 30, 2016

(30) Foreign Application Priority Data

Nov. 25, 2015 (JP) ................................ 2015-229460

(51) Int. Cl.
| | |
|---|---|
| *H01L 23/495* | (2006.01) |
| *H01R 4/30* | (2006.01) |
| *H01L 23/50* | (2006.01) |
| *H01L 23/498* | (2006.01) |
| *H01R 12/58* | (2011.01) |

(52) U.S. Cl.
CPC .......... *H01R 4/30* (2013.01); *H01L 23/49811* (2013.01); *H01L 23/50* (2013.01); *H01R 12/58* (2013.01)

(58) Field of Classification Search
CPC ............... H01L 23/49524; H01L 23/60; H01L 23/49562; H01L 23/3107; H01L 2924/0002; H01L 2924/00; H01L 2924/01078; H01L 2924/01079; H01L 2224/48247; H01L 2224/48091; H01L 23/50; H01L 23/49811; H01R 4/30; H01R 12/58
See application file for complete search history.

(56) References Cited

U.S. PATENT DOCUMENTS

| | | | |
|---|---|---|---|
| 2012/0119256 A1 | 5/2012 | Okita | |
| 2014/0218991 A1 | 8/2014 | Chen et al. | |
| 2016/0372392 A1* | 12/2016 | Sakamoto | ............. H01L 23/055 |

FOREIGN PATENT DOCUMENTS

| | | |
|---|---|---|
| JP | 2006-324585 A | 11/2006 |
| JP | 2012-110095 A | 6/2012 |
| JP | 2014-155287 A | 8/2014 |

\* cited by examiner

*Primary Examiner* — Hoa B Trinh
(74) *Attorney, Agent, or Firm* — Rabin & Berdo, P.C.

(57) ABSTRACT

In a semiconductor device, a plurality of semiconductor units is electrically connected in parallel using a connecting device. The connecting device includes a first connecting unit and a second connecting unit. The first connecting unit is electrically connected to a control terminal of each semiconductor unit. The second connecting unit is electrically connected to a main terminal of each semiconductor unit.

13 Claims, 16 Drawing Sheets

SEMICONDUCTOR DEVICE

CROSS-REFERENCE TO RELATED APPLICATION

This application is based upon and claims the benefit of priority of the prior Japanese Patent Application No. 2015-229460, filed on Nov. 25, 2015, the entire contents of which are incorporated herein by reference.

BACKGROUND OF THE INVENTION

1. Field of the Invention

Embodiments discussed herein relate to semiconductor devices.

2. Background of the Related Art

A semiconductor device called a power semiconductor module includes a semiconductor chip having formed therein semiconductor elements, such as an IGBT (Insulated Gate Bipolar Transistor), a MOSFET (Metal Oxide Semiconductor Field Effect Transistor), and an FWD (Free Wheeling Diode), and is widely used as a power conversion device.

Then, a power semiconductor module with a three-level inverter circuit is recently applied in the fields of wind power generation, solar power generation, and the like where an increase in efficiency is demanded, (e.g., see Japanese Laid-open Patent Publication No. 2006-324585).

In the power semiconductor module of Japanese Laid-open Patent Publication No. 2006-324585, when a voltage is applied from a connection terminal, a current will be output from another connection terminal through an element inside the module and through the conductive layer for wiring. Because the capacity of a current that is output in this manner is large but the current path from a portion where the current is input to a portion where the current is output is long, it is difficult to suppress the inductance of a wiring.

Moreover, because the conductive layer for wiring is needed on a laminated substrate in addition to the conductive layer for mounting an element, a laminated substrate having a larger area is needed in order to achieve an increase in current capacity. Therefore, in order to achieve an increase in capacity, an increase in size of the power semiconductor module is inevitable. Moreover, because the current path becomes longer due to an increase in size, it becomes more difficult to suppress the inductance of a wiring.

SUMMARY OF THE INVENTION

According to one aspect, there is provided a semiconductor device including a plurality of semiconductor units and a connecting device which electrically connects the semiconductor units in parallel, wherein each of the semiconductor units includes: a laminated substrate which has an insulating board and a circuit board arranged on a front surface of the insulating board; a plurality of semiconductor elements each having a rear surface fixed to the circuit board and a front surface having a main electrode and a control electrode; a wiring member electrically connected to the main electrode and the control electrode of the semiconductor element; a control terminal electrically connected to the control electrode of the semiconductor element via the wiring member; and a main terminal electrically connected to the main electrode of the semiconductor element via the wiring member, wherein the laminated substrate, the semiconductor element and the wiring member constitute a three-level inverter circuit, inside the semiconductor unit, and wherein the connecting device includes: a first connecting unit electrically connected to the control terminal of each of the plurality of semiconductor units, and a second connecting unit electrically connected to the main terminals of each of the plurality of semiconductor units.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, embodiments will be described using the accompanying drawings.

First, a semiconductor device will be described using FIGS. 1A and 1B.

Figure 1A:
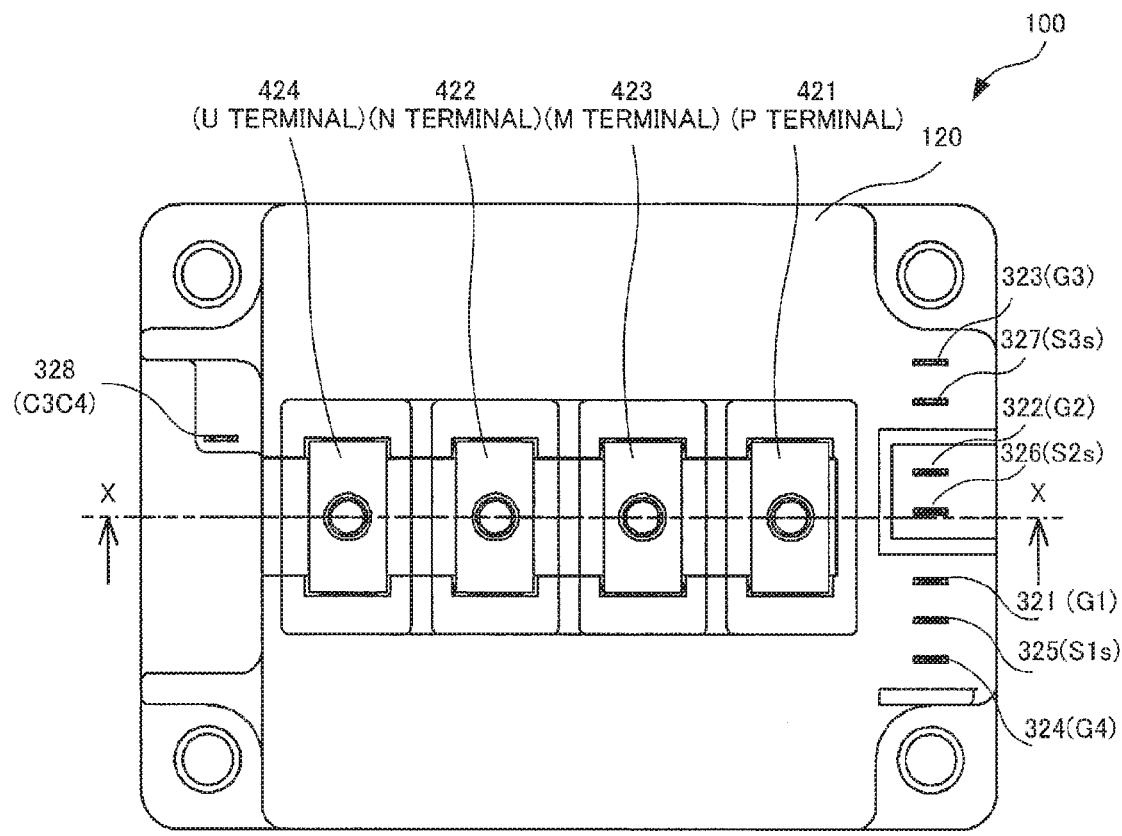
FIGS. 1A and 1B illustrate a semiconductor device in an embodiment.
Figure 1B:
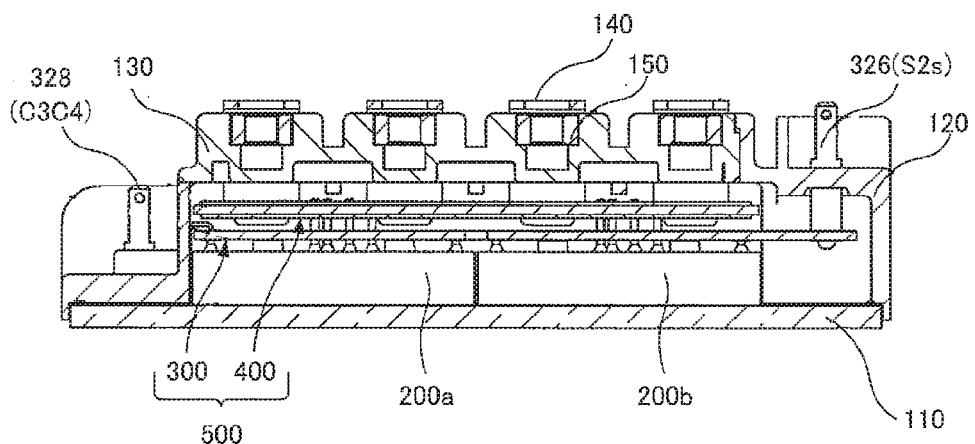

FIGS. 1A and 1B illustrate the semiconductor device in an embodiment.

Note that, FIG. 1A is the top view of a semiconductor device 100, while FIG. 1B is the cross sectional view along the one-dot chain line X-X of FIG. 1A.

The semiconductor device 100 includes: a metal base 110 made from the material, such as copper, excellent in thermal radiation; and four semiconductor units 200a, 200b, 200c, and 200d arranged in 2 rows and 2 columns on the metal base 110 (hereinafter, these semiconductor units will be collectively referred to as also semiconductor units 200). Note that the semiconductor unit 200 includes a MOSFET and an SBD (Schottky Barrier Diode), and has a three-level inverter circuit formed therein.

Moreover, for the semiconductor units 200 arranged in this manner, the semiconductor device 100 has arranged therein a connecting device 500 which electrically connects the semiconductor units 200 in parallel.

The connecting device 500 includes a first connecting unit 300 and a second connecting unit 400. The first connecting unit 300 faces the principal surfaces of the plurality of semiconductor units 200, and is electrically connected to the control terminal of each semiconductor unit 200. The second connecting unit 400 is arranged above the first connecting unit 300, and is electrically connected to the main terminal of each semiconductor unit 200. Note that, the control terminal is electrically connected to a control electrode, such as the gate electrode of a MOSFET included in the semiconductor unit 200. Moreover, the main terminal is electrically connected to main electrodes, such as the source electrode and anode electrode of a MOSFET and SBD included in the semiconductor unit.

Furthermore, in the semiconductor device 100, on the metal base 110, such a semiconductor unit 200, first connecting unit 300, and second connecting unit 400 are covered with a case 120 made from resin.

Note that, the first connecting unit 300 includes a circuit layer electrically connected to a G1 terminal, G2 terminal, G3 terminal, G4 terminal, S1s terminal, S2s terminal, S3s terminal, and C terminal, respectively, which are the control terminals of each semiconductor unit 200. Then, the first connecting unit 300 includes external control terminals 321 to 328 that are electrically connected to each control terminal of the semiconductor unit 200 via the relevant circuit layer.

Moreover, the second connecting unit 400 includes a circuit board electrically connected to a P terminal, N terminal, M terminal, and U terminal, respectively, which are the main terminals of each semiconductor unit 200. Then, the second connecting unit 400 includes external terminals 421 to 424 that are electrically connected to each main terminal of the semiconductor unit 200 via the relevant circuit board.

Note that, the details of the semiconductor unit 200, first connecting unit 300, and second connecting unit 400 will be described later.

In the case 120, the external control terminals 321 to 328 led out from the first connecting unit 300 are exposed to the outside. Moreover, in the case 120, the external terminals 421 to 424 led out from the second connecting unit 400 are exposed to the outside. Note that a nut case 130 is attached to the external terminals 421 to 424. Each of the external terminals 421 to 424 is attached to the nut case 130 via a nut 150 using the main terminal 140.

Next, the method for assembling such a semiconductor device 100 will be described using FIGS. 2A and 2B and FIGS. 3A and 3B.

FIGS. 2A and 2B and FIGS. 3A and 3B illustrate the method for assembling the semiconductor device in the embodiment.

Note that, FIGS. 2A and 2B and FIGS. 3A and 3B illustrate each assembly process of the semiconductor device 100, respectively.

Figure 2A:
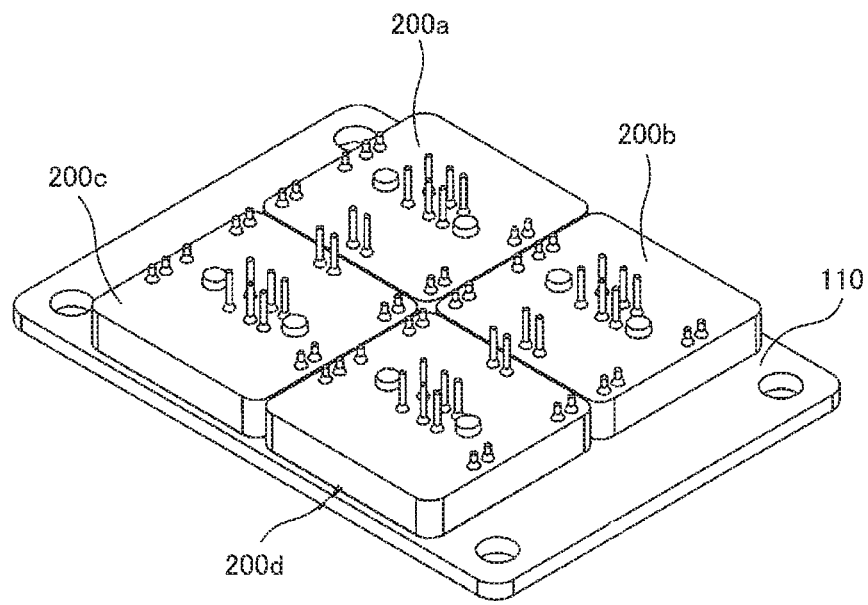
FIGS. 2A and 2B illustrate a method for assembling the semiconductor device in the embodiment (part 1).

First, the metal base 110 is prepared. Next, a bonding material is provided in the front surface of the metal base 110, and four semiconductor units 200a, 200b, 200c, and 200d in 2 rows and 2 columns are arranged in the relevant bonding material (FIG. 2A).

Next, the first connecting unit 300 is arranged above the four semiconductor units 200a to 200d arranged in the metal base 110.

Figure 2B:
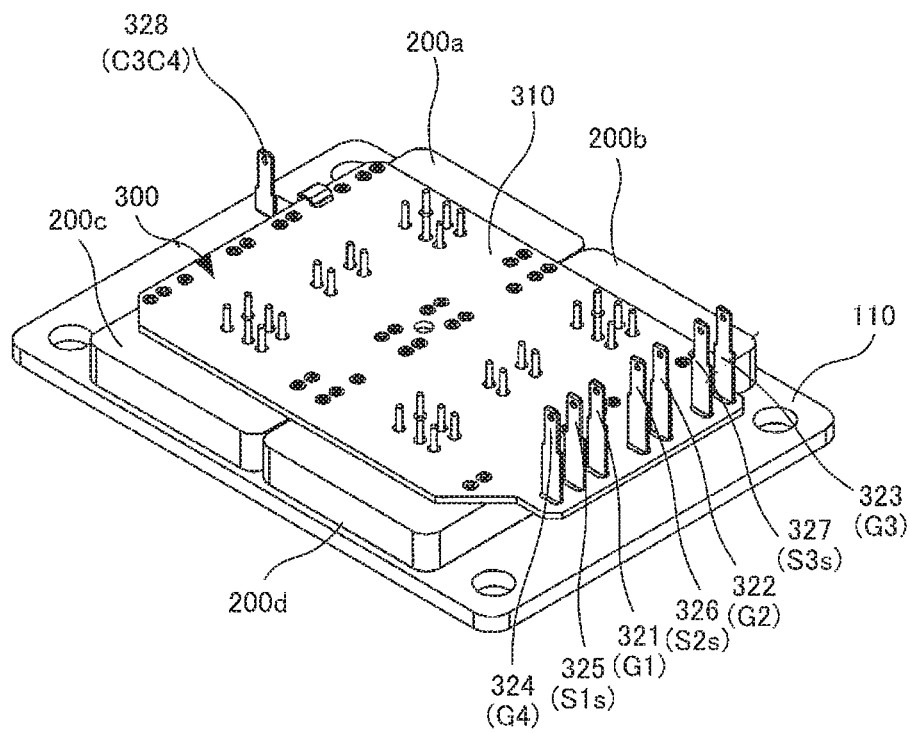

The first connecting unit 300 includes: a base substance 310 having arranged therein the circuit layer electrically connected to each control terminal of the semiconductor units 200a to 200d; and the external control terminals 321 to 328 electrically connected to each circuit layer of the base substance 310 and led out to the outside. In the first connecting unit 300 arranged above the four semiconductor units 200a to 200d, the main terminals of the semiconductor units 200a to 200d penetrate the base substance 310 while being insulated therefrom. Moreover, the control terminals of the semiconductor units 200a to 200d are electrically connected to each circuit layer inside the base substance 310 (FIG. 2B).

Above the first connecting unit 300 arranged on the four semiconductor units 200, the second connecting unit 400 is further arranged. Note that the gap between the first connecting unit 300 and the second connecting unit 400 arranged above the first connecting unit 300 is approximately 2 mm.

Figure 3A:
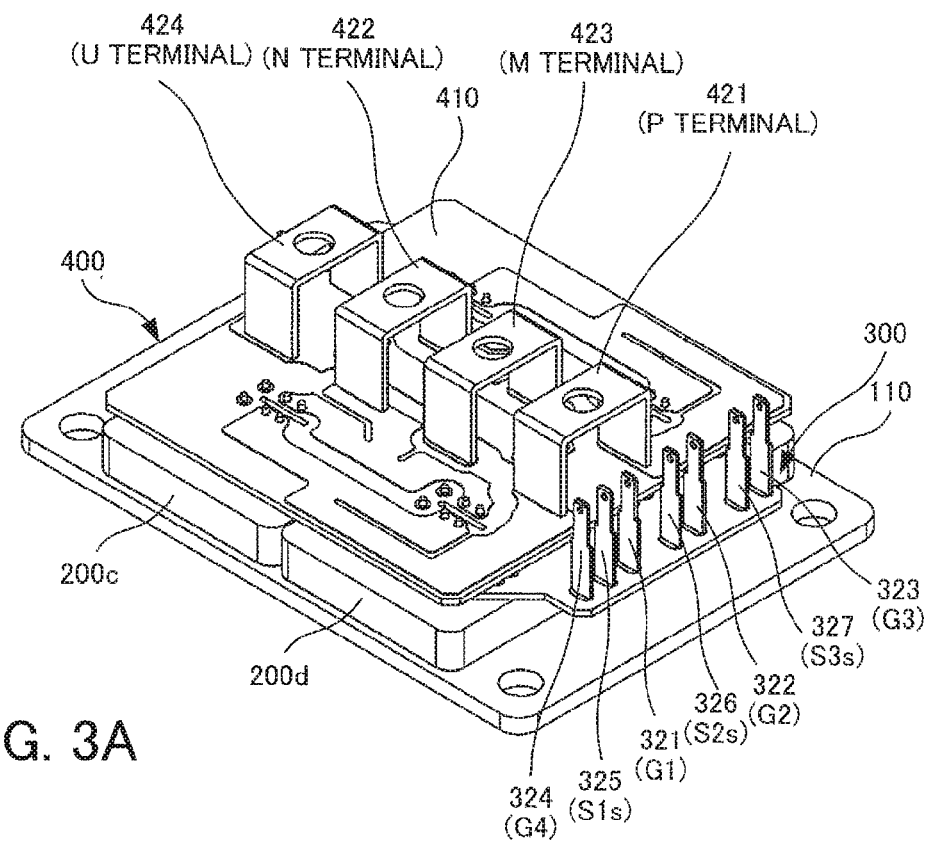
FIGS. 3A and 3B illustrate the method for assembling the semiconductor device in the embodiment (part 2).

The second connecting unit 400 includes: an insulating board 410 which includes, on the front surface and rear surface thereof, respectively, the circuit board electrically connected to the main terminals of the semiconductor units 200a to 200d; and the external terminals 421 to 424 electrically connected to each circuit board of the insulating board 410. When arranged above the first connecting unit 300, the second connecting unit 400 is electrically connected to the main terminals of the semiconductor units 200a to 200d, the main terminals penetrating the base substance 310 of the first connecting unit 300 (FIG. 3A).

Figure 3B:
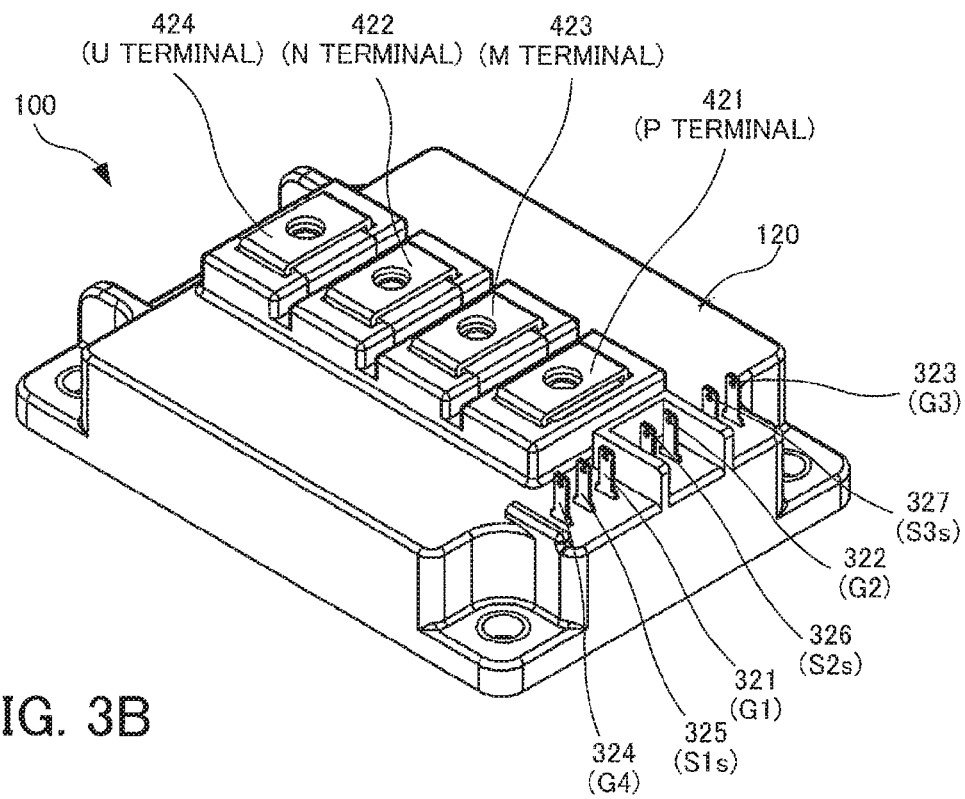

In this manner, the case 120 is attached onto the metal base 110 so as to cover the semiconductor units 200a to 200d, first connecting unit 300, and second connecting unit 400 arranged above the metal base 110, and expose the external control terminals 321 to 328 and external terminals 421 to 424. Note that the external terminals 421 to 424 each have an inverted-U-shaped cross section. Next, as needed, gel or resin is poured into the case 120 and cured to improve internal insulating properties. Then, a nut case containing the nuts 150 is inserted between two forks of the external terminals 421 to 424 so that the main terminals may be attached to an external wiring via the nuts (FIG. 3B).

In this manner, the semiconductor device 100 is assembled by going through the steps of FIGS. 2A and 2B and FIGS. 3A and 3B.

Note that, in the semiconductor device 100, the metal base 110 is not always needed but may be omitted.

Moreover, in the semiconductor unit 200 of the semiconductor device 100, the semiconductor units 200c and 200d each have the shape obtained by inverting the configuration of each of the semiconductor units 200a and 200b. These will be described later.

Next, the details of the semiconductor unit 200, first connecting unit 300, and second connecting unit 400 of the semiconductor device 100 will be described.

First, the semiconductor unit 200 will be described using FIG. 4.

Figure 4:
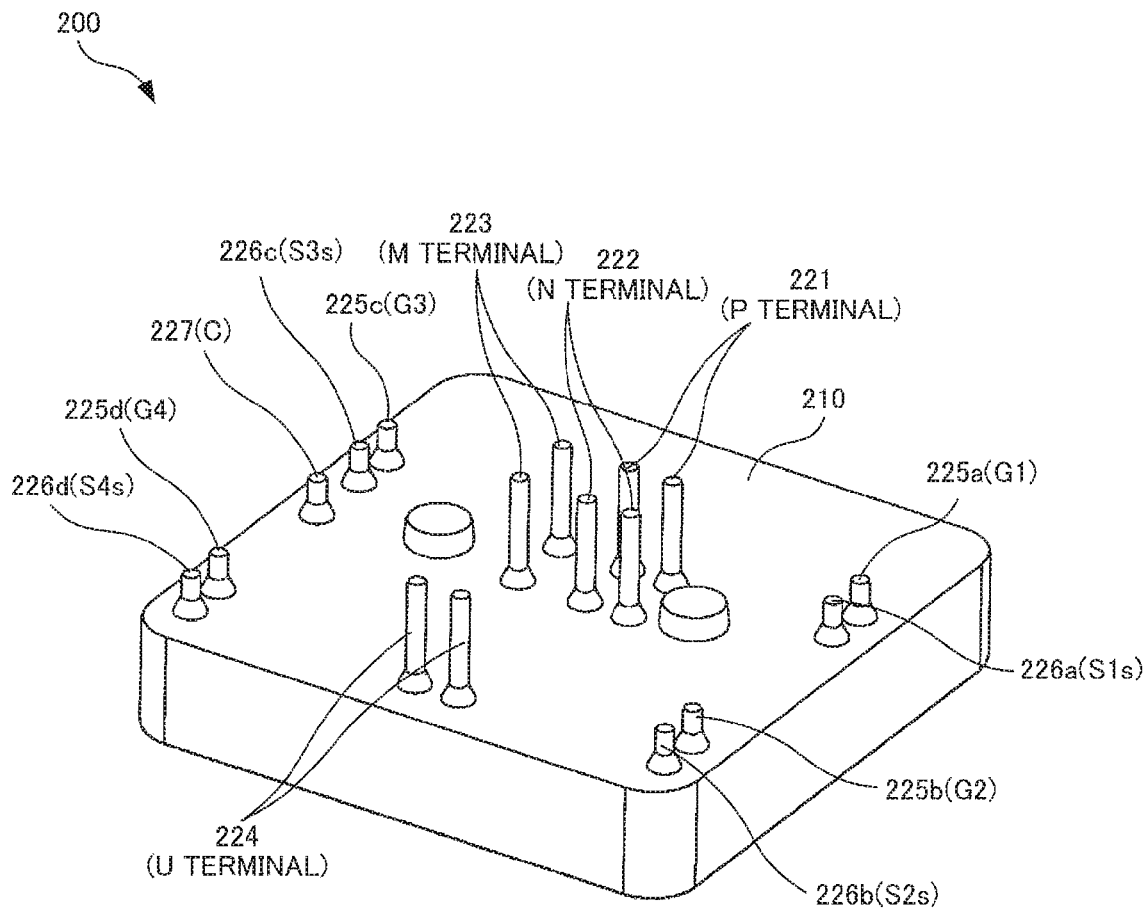
FIG. 4 is a perspective view illustrating a semiconductor unit of the semiconductor device in the embodiment.

FIG. 4 is a perspective view illustrating the semiconductor unit of the semiconductor device in the embodiment.

The semiconductor unit 200 is molded with a resin 210 made from a thermosetting resin. In such a semiconductor unit 200, main terminals 221 to 224 and control terminals 225a to 225d, 226a to 226d, and 227 protrude from one surface (the upper surface, in the view) of the resin 210.

Note that, the main terminal 221 corresponds to the P terminal, the main terminal 222 corresponds to the N terminal, the main terminal 223 corresponds to the M terminal having an intermediate potential between the P terminal and the N terminal, and the main terminal 224 corresponds to the U terminal for outputting to a non-illustrated load, respectively.

Moreover, the control terminal 225a corresponds to the G1 terminal, the control terminal 225b corresponds to the G2 terminal, the control terminal 225c corresponds to the G3 terminal, and the control terminal 225d corresponds to the G4 terminal, respectively. Furthermore, the control terminal 226a corresponds to the S1s terminal, the control terminal 226b corresponds to the S2s terminal, the control terminal 226c corresponds to the S3s terminal, the control terminal 226d corresponds to the S4s terminal, respectively, and the control terminal 227 corresponds to the C terminal.

Note that, although FIG. 4 illustrates a case where the semiconductor unit 200 alone is molded with the resin 210, molding of the semiconductor unit 200 alone with the resin 210 is not always needed. For example, as with a typical power semiconductor module, the power semiconductor module may be sealed with gel after all the components thereof are electrically and mechanically connected. However, molding with the resin 210 will improve the breakdown voltage characteristic, and also improves the power cycle and heat cycle tolerances and the like, as compared with typical gel sealing. If the semiconductor unit 200 alone is molded with resin, a damage and the like due to the introduction of a foreign matter into the semiconductor unit 200 may be prevented, and therefore handling during assembling of a plurality of semiconductor units 200 is facilitated.

Note that, the semiconductor unit 200 may be molded with the resin 210, but it does not always need to be molded with the resin 210.

Moreover, when the semiconductor device 100 is assembled as illustrated in FIGS. 3A and 3B, the inside of the semiconductor device 100 may be sealed with gel, or may be filled with a thermosetting resin and sealed. Moreover, the semiconductor device 100 does not always need to be sealed with a sealant when assembled.

Next, the internal structure sealed with the resin 210 of such a semiconductor unit 200 will be described using FIGS. 5 to 7.

Figure 5:
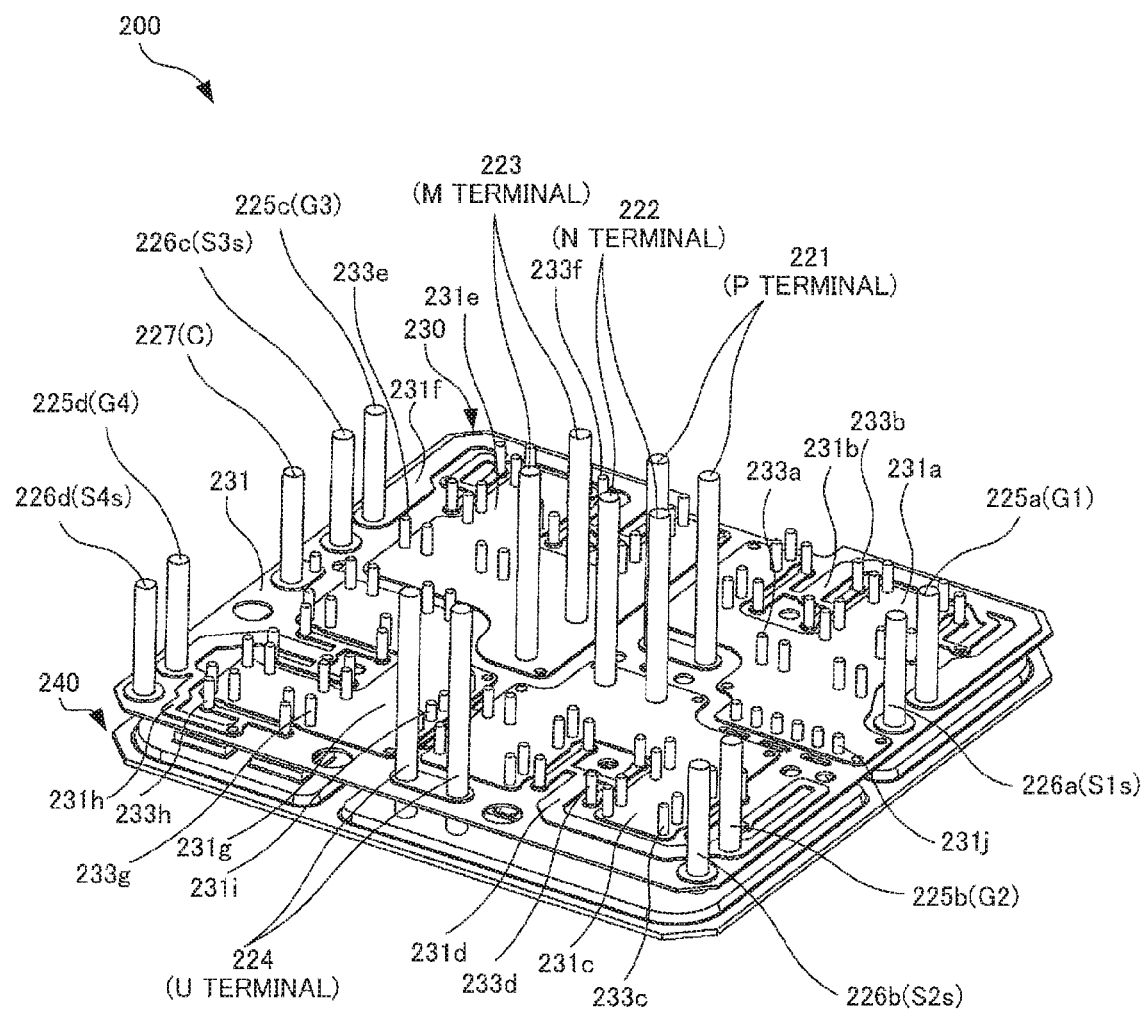
FIG. 5 illustrates an internal structure of the semiconductor unit of the semiconductor device in the embodiment.
Figure 6:
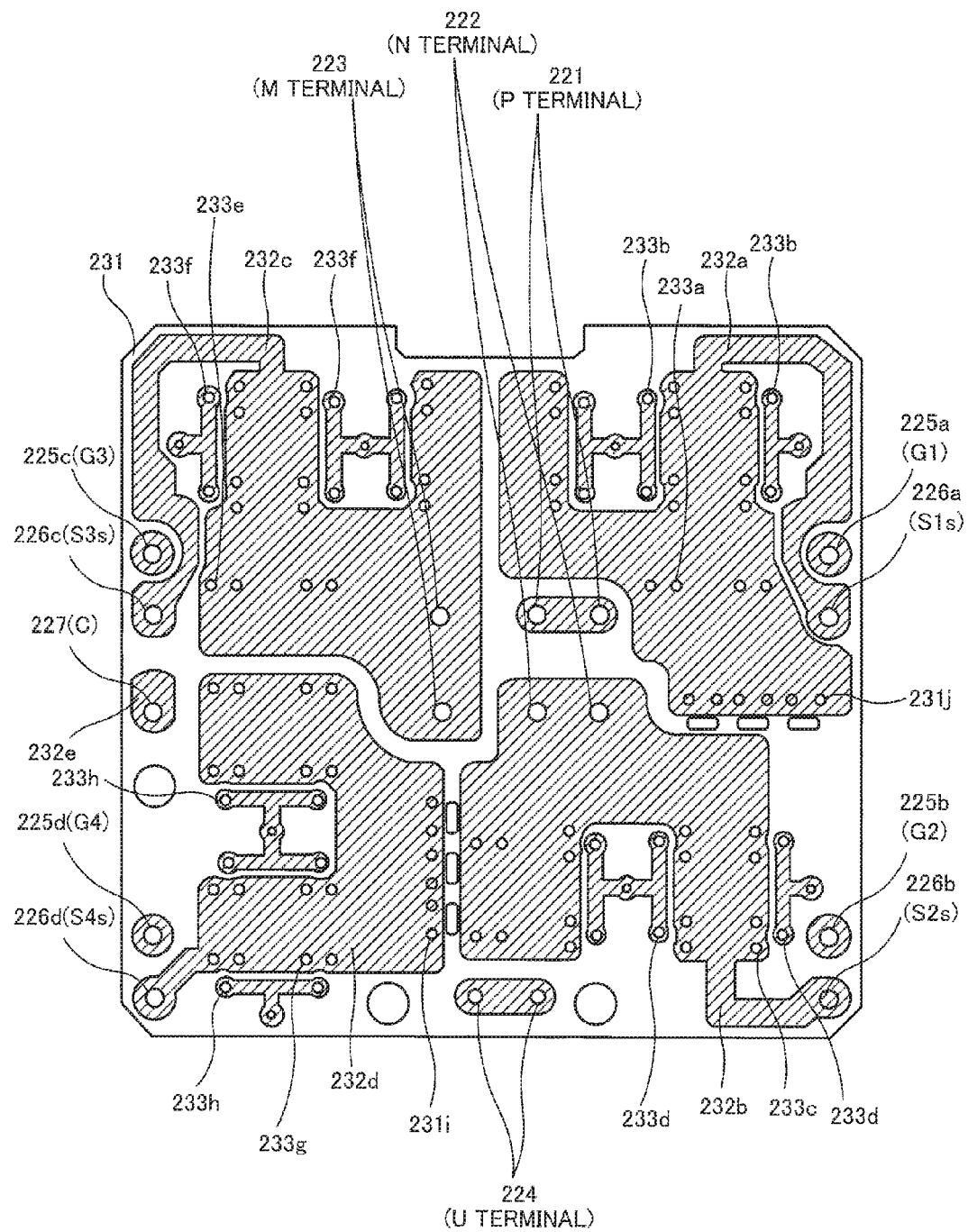
FIG. 6 illustrates a circuit layer on the rear side of a printed circuit board of the semiconductor unit of the semiconductor device in the embodiment.

FIG. 5 illustrates the internal structure of the semiconductor unit of the semiconductor device in the embodiment, while FIG. 6 illustrates the circuit layer on the rear side of the printed circuit board of the semiconductor unit of the semiconductor device in the embodiment (when seen through from the upper part of FIG. 5).

Figure 7:
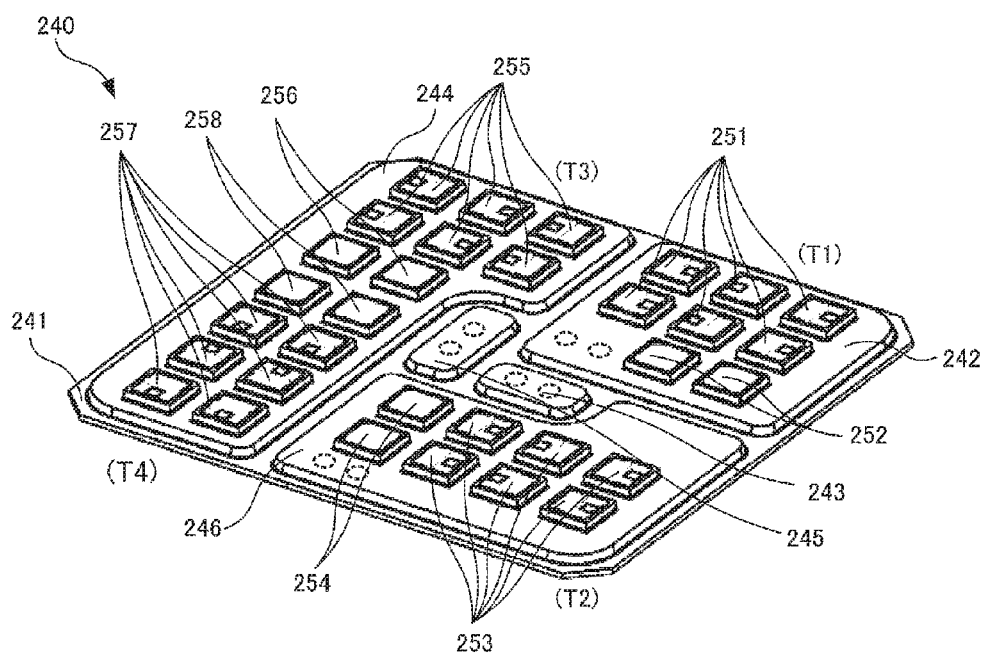
FIG. 7 is a perspective view illustrating a laminated substrate of the semiconductor unit of the semiconductor device in the embodiment.

FIG. 7 is a perspective view illustrating a laminated substrate of the semiconductor unit of the semiconductor device in the embodiment.

The semiconductor unit 200 includes: a laminated substrate 240; semiconductor elements 251, 253, 255, and 257 and diodes 252, 254, 256, and 258 arranged on the laminated substrate 240; main terminals 221 to 224; control terminals 225a to 225d, 226a to 226d, and 227; and a printed circuit board 230 having provided therein a plurality of conductive posts 233a to 233h which is the wiring members. In the present specification and claims, the term "semiconductor element" refers to an element, device, or structure made up of a semiconductor material that selectively transmits current through the element, device, or structure based on the semiconductor properties of the element. Examples include transistors, MOSFETs, IGBTs, and any other semiconductor-based switches, as well as diodes, including freewheeling diodes, which selectively transmit current based on a direction of the flow of current through the diode. The term "semiconductor element" also refers to a combination of individual elements, such as two or more transistors connected together, or one or more transistors connected together with one or more diodes.

The laminated substrate 240 includes an insulating board 241 made from ceramics or the like, and circuit boards 242 to 246, as illustrated in FIG. 7. The circuit boards 242 to 246 are arranged on the principal surface (front surface) of the insulating board 241. Moreover, the laminated substrate 240 includes a metal plate (illustration is omitted) on the surface (rear surface) on the opposite side of the principal surface of the insulating board 241.

The circuit boards 242 to 246 are formed from a conductive material, and are electrically insulated from each other and arranged on the principal surface of the insulating board 241. As the laminated substrate 240, a DCB (Direct Copper Bonding) substrate or an AMB (Active Metal Bonding) substrate may be used, for example.

Among them, in the circuit board 242, a semiconductor element 251 (T1) which is a MOSFET made from silicon carbide and a diode 252 which is an SBD are arranged, respectively, for example. In the circuit board 246, a semiconductor element 253 (T2) which is a MOSFET made from silicon carbide and a diode 254 which is an SBD are arranged, respectively, for example. In the circuit board 244, a semiconductor element 255 (T3) which is a MOSFET made from silicon carbide and a diode 256 which is an SBD are arranged, respectively, for example. Similarly, in the circuit board 244, a semiconductor element 257 (T4) which is a MOSFET made from silicon carbide and a diode 258 which is an SBD are arranged, respectively, for example.

Note that, the drain electrodes on the rear surfaces of the semiconductor elements 251, 253, 255, and 257 are electrically connected to the circuit boards 242, 246, and 244 using a conductive bonding material. Moreover, the cathode terminals on the rear surfaces of the diodes 252, 254, 256, and 258 are electrically connected to the circuit boards 242, 246, and 244, respectively, using a conductive bonding material.

The printed circuit board 230 includes: a resin layer 231 formed from a planar resin; and conductive circuit layers 231a to 231h arranged on the front surface of the resin layer 231 in FIG. 5. Furthermore, the printed circuit board 230 includes conductive circuit layers 232a to 232d arranged on the rear surface of the resin layer 231, as illustrated in FIG. 6.

Moreover, a plurality of protruding main terminals 221 to 224 is provided on the front surface side and rear surface side of the printed circuit board 230, respectively. Moreover, the main terminal 221 is electrically connected to the circuit board 242 of the laminated substrate 240, the main terminal 222 is electrically connected to the circuit board 243 of the laminated substrate 240, the main terminal 223 is electrically connected to the circuit board 245 of the laminated substrate 240, and the main terminal 224 is electrically connected to the circuit board 246 of the laminated substrate 240, respectively (the broken line circles in FIG. 7 indicate the connection positions).

Then, a plurality of control terminals 225a to 225d is electrically connected to the corresponding circuit layers 231b, 231d, 231f, and 231h on the front surface, respectively (FIG. 5). Moreover, the control terminals 226a to 226d, and 227 are electrically connected to the corresponding circuit layers 232a to 232e, respectively, on the rear surface (FIG. 6).

Furthermore, the conductive post 233a is electrically connected to the circuit layer 231a on the front surface of the printed circuit board 230 and to the circuit layer 232a on the rear surface thereof. The conductive post 233b is electrically connected to the circuit layer 231b on the front surface of the printed circuit board 230 and to the circuit layer (reference sign is omitted) on the rear surface side thereof. Then, the conductive post 233a is connected to the source electrode of the semiconductor element 251 and to the anode electrode of the diode 252, respectively. The conductive post 233b is connected to the gate electrode of the semiconductor element 251.

The conductive post 233c is electrically connected to the circuit layer 231c on the front surface of the printed circuit board 230 and to the circuit layer 232b on the rear surface thereof. The conductive post 233d is electrically connected to the circuit layer 231d on the front surface of the printed circuit board 230 and to the circuit layer (reference sign is omitted) on the rear surface side thereof. Then, the conductive post 233c is connected to the source electrode of the semiconductor element 253 and to the anode electrode of the diode 254, respectively. The conductive post 233d is connected to the gate electrode of the semiconductor element 253.

The conductive post 233e is electrically connected to the circuit layer 231e on the front surface of the printed circuit board 230 and to the circuit layer 232c on the rear surface thereof. The conductive post 233f is electrically connected to the circuit layer 231f on the front surface of the printed circuit board 230 and to the circuit layer (reference sign is omitted) on the rear surface side thereof. Then, the conductive post 233e is connected to the source electrode of the semiconductor element 255 and to the anode electrode of the diode 256, respectively. The conductive post 233f is connected to the gate electrode of the semiconductor element 255.

The conductive post 233g is electrically connected to the circuit layer 231g on the front surface of the printed circuit board 230 and to the circuit layer 232d on the rear surface thereof. The conductive post 233h is electrically connected to the circuit layer 231h on the front surface of the printed circuit board 230 and to the circuit layer (reference sign is omitted) on the rear surface side thereof. Then, the conductive post 233g is connected to the source electrode of the semiconductor element 257 and to the anode electrode of the diode 258, respectively. The conductive post 233h is connected to the gate electrode of the semiconductor element 257.

Moreover, the conductive post 231i electrically connects the circuit layer 231g of the printed circuit board 230 to the circuit board 246 of the laminated substrate 240.

The conductive post 231j electrically connects the circuit layer 231a of the printed circuit board 230 to the circuit board 246 of the laminated substrate 240.

Moreover, the control terminals 226a to 226d are electrically connected to the respective source electrodes of the semiconductor elements 251, 253, 255, and 257 via the circuit layers 232a to 232d on the rear surface of the printed circuit board 230 and via the conductive posts 233a, 233c, 233e, and 233g, respectively. That is, the control terminals 226a to 226d have the function to detect the source potentials output from the semiconductor elements 251, 253, 255, and 257, respectively.

In the semiconductor unit 200, the printed circuit board 230, which is the wiring member, is set to such a laminated substrate 240, as illustrated in FIG. 5.

The connection positions of the conductive posts 233a to 233h, which are the wiring members, relative to the laminated substrate 240 in this case and the circuit configuration in the semiconductor unit 200 will be described using FIGS. 5 to 9.

Figure 8:
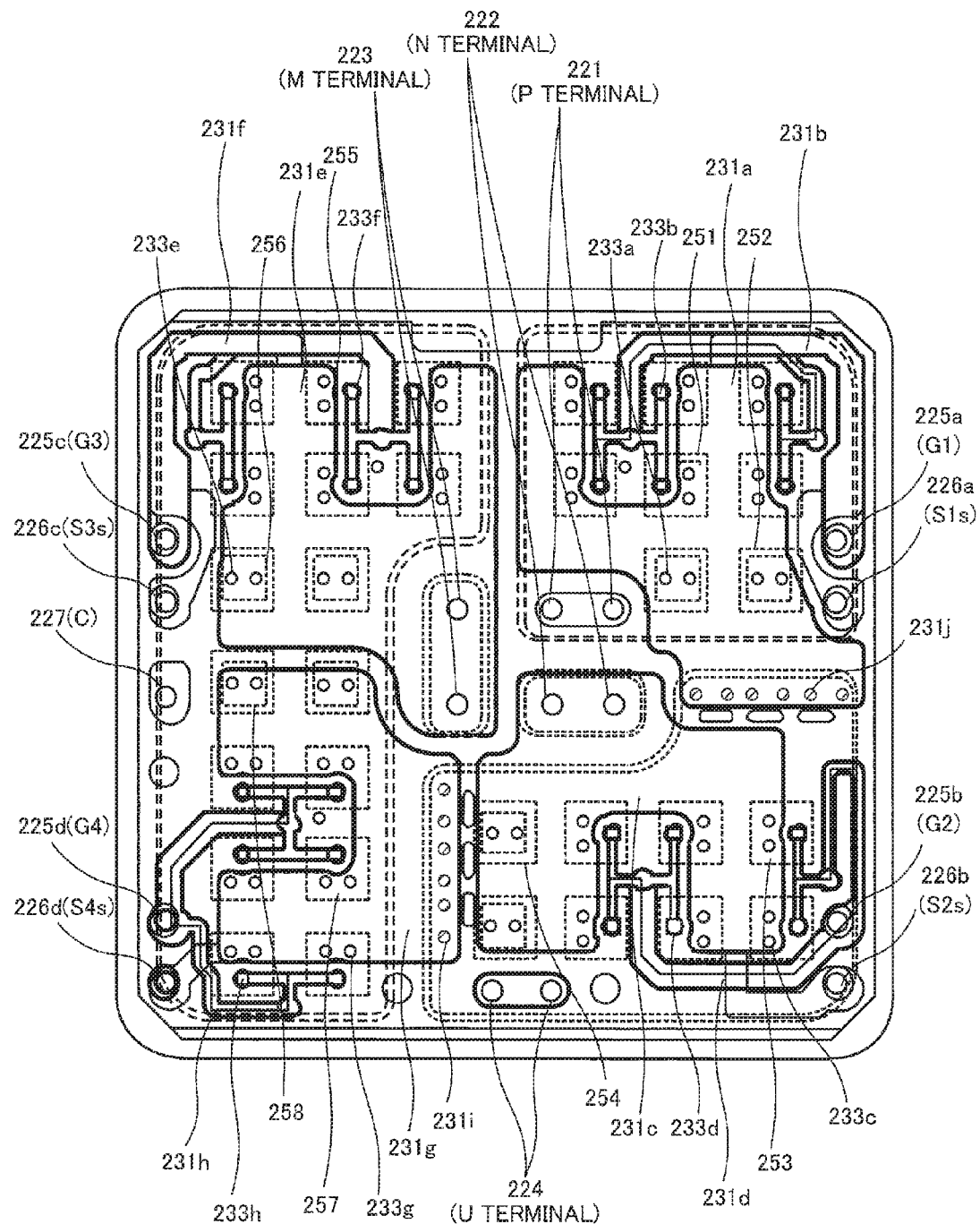
FIG. 8 illustrates connection positions of conductive posts relative to the laminated substrate of the semiconductor unit of the semiconductor device in the embodiment (part 1).

FIG. 8 illustrates the connection positions of the conductive posts relative to the laminated substrate of the semiconductor unit of the semiconductor device in the embodiment.

Note that, FIG. 8 illustrates the printed circuit board 230 that is overlapped on the top view of the semiconductor unit 200 illustrated in FIG. 5. Here, the components of the laminated substrate 240 are indicated by dashed lines.

Figure 9:
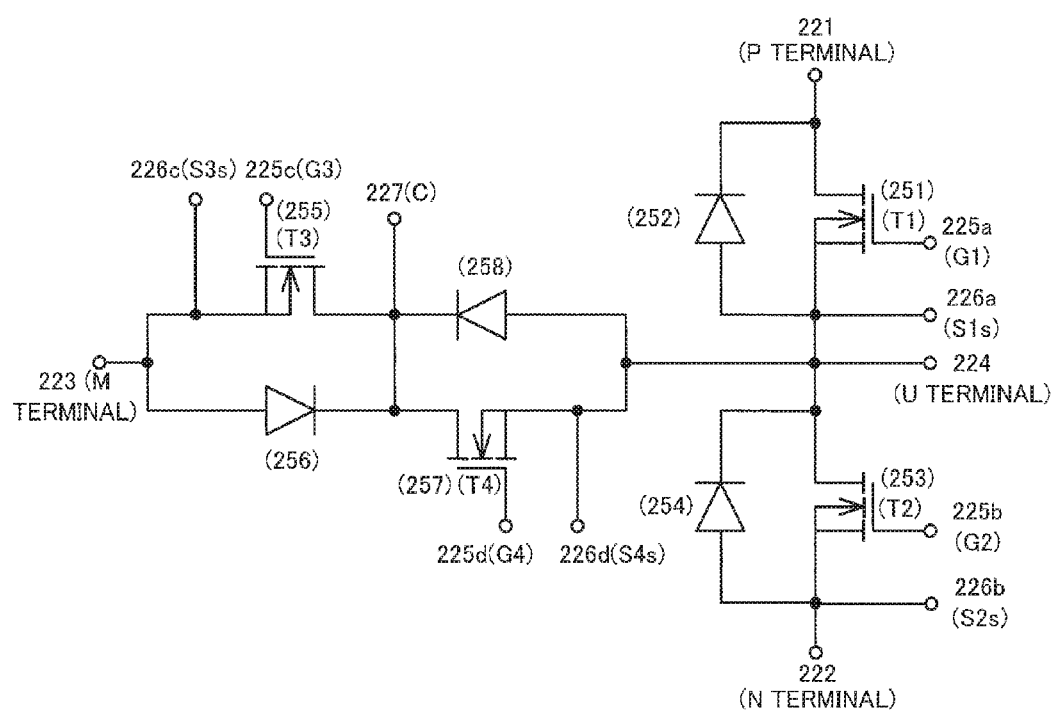
FIG. 9 illustrates a circuit configuration inside the semiconductor unit of the semiconductor device in the embodiment.

Moreover, FIG. 9 illustrates the circuit configuration inside the semiconductor unit of the semiconductor device in the embodiment.

A plurality of conductive posts 233a is electrically connected to the electrodes on the front surfaces of the semiconductor element 251 and diode 252. Specifically, the conductive post 233a is connected to the main electrode (source electrode) of the semiconductor element 251 and to the anode electrode of the diode 252, respectively.

A plurality of conductive posts 233b is electrically connected to the electrodes on the front surface of the semiconductor element 251. Specifically, the conductive post 233b is connected to the gate electrode of the semiconductor element 251.

A plurality of conductive posts 233c is electrically connected to the electrodes on the front surfaces of the semiconductor element 253 and diode 254. Specifically, the conductive post 233c is connected to the main electrode (source electrode) of the semiconductor element 253 and to the anode electrode of the diode 254, respectively.

A plurality of conductive posts 233d is electrically connected to the electrodes on the front surface of the semiconductor element 253. Specifically, the conductive post 233d is connected to the gate electrode of the semiconductor element 253.

A plurality of conductive posts 233e is electrically connected to the electrodes on the front surfaces of the semiconductor element 255 and diode 256. Specifically, the conductive post 233e is connected to the main electrode (source electrode) of the semiconductor element 255 and to the anode electrode of the diode 256, respectively.

A plurality of conductive posts 233f is electrically connected to the electrodes on the front surface of the semiconductor element 255. Specifically, the conductive post 233f is connected to the gate electrode of the semiconductor element 255.

A plurality of conductive posts 233g is electrically connected to the electrodes on the front surfaces of the semiconductor element 257 and diode 258. Specifically, the conductive post 233g is connected to the main electrode (source electrode) of the semiconductor element 257 and to the anode electrode of the diode 258, respectively.

A plurality of conductive posts 233h is electrically connected to the electrodes on the front surface of the semiconductor element 257. Specifically, the conductive post 233h is connected to the gate electrode of the semiconductor element 257.

Then, the control terminal 225a is electrically connected to the gate electrode of the semiconductor element 251 via the circuit layer 231b and conductive post 233b of the printed circuit board 230. Then, once a gate voltage is applied to the control terminal 225a based on an external control signal, the gate voltage is applied to the gate electrode of the semiconductor element 251 and the semiconductor element 251 is turned on (becomes in a conductive state) from being tuned off (from a cut-off state).

The control terminal 225b is electrically connected to the gate electrode of the semiconductor element 253 via the circuit layer 231d and conductive post 233d of the printed circuit board 230. Then, once a gate voltage is applied to the control terminal 225b based on an external control signal, the gate voltage is applied to the gate electrode of the semiconductor element 253 and the semiconductor element 253 is turned on from being tuned off.

The control terminal 225c is electrically connected to the gate electrode of the semiconductor element 255 via the circuit layer 231f and conductive post 233f of the printed circuit board 230. Then, once a gate voltage is applied to the control terminal 225c based on an external control signal, the gate voltage is applied to the gate electrode of the semiconductor element 255 and the semiconductor element 255 is turned on from being tuned off.

The control terminal 225d is electrically connected to the gate electrode of the semiconductor element 257 via the circuit layer 231h and conductive post 233h of the printed circuit board 230. Then, once a gate voltage is applied to the control terminal 225d based on an external control signal, the gate voltage is applied to the gate electrode of the semiconductor element 257 and the semiconductor element 257 is turned on from being tuned off.

A plurality of conductive posts 231i is electrically connected to the circuit board 246 of the laminated substrate 240. That is, the conductive post 231i electrically connects the circuit layer 231g of the printed circuit board 230 to the circuit board 246 of the laminated substrate 240.

A plurality of conductive posts 231j is electrically connected to the circuit board 246 of the laminated substrate 240. That is, the conductive post 231j electrically connects the circuit layer 231a of the printed circuit board 230 to the circuit board 246 of the laminated substrate 240.

Note that, the control terminals 226a to 226d are electrically connected to the respective source electrodes of the semiconductor elements 251, 253, 255, and 257 via the circuit layers 232a to 232d on the rear surface of the printed circuit board 230.

In this manner, the laminated substrate 240, the semiconductor elements 251, 253, 255, and 257, the diodes 252, 254, 256, and 258, the printed circuit board 230, and the control terminals 225a to 225d, 226a to 226d, and 227 constitute, inside the semiconductor unit 200, a three-level inverter circuit illustrated in FIG. 9.

Then, a high potential terminal of an external power supply is connected to the main terminal 221 which is the P terminal, and a low potential terminal of the external power supply is connected to the main terminal 222 which is the N terminal. Moreover, an intermediate potential terminal of the external power supply is connected to the main terminal 223 which is the M terminal. Then, a load (illustration is omitted) is connected to the main terminal 224 which is the output terminal (U terminal) of the semiconductor unit 200. Thus, the semiconductor unit 200 functions as a three-level inverter.

In the three-level inverter, generally, when the polarity of the output voltage of the inverter is positive, T1 and T3 are alternately turned on and off, T4 is put in a normally-on state, and T2 is put in a normally-off state. On the contrary, when the polarity of the output voltage of the inverter is negative, T2 and T4 are alternately turned on and off, T3 is put in a normally-on state, and T1 is put in a normally-off state.

Meanwhile, an input voltage from the external power supply is applied from the main terminal 221, which is the P terminal, to the drain electrode of the semiconductor element 251 via the circuit board 242 of the laminated substrate 240. Then, for example, in outputting a voltage having the positive polarity, a turn-on signal is supplied to T1. Then, a current is output from the source electrode on the front surface of the semiconductor element 251, and forms the output current.

The current output from the source electrode of the semiconductor element 251 flows into the circuit layer 231a of the printed circuit board 230 via the conductive post 233a connected to the source electrode. The output current further flows from the conductive post 231j into the circuit board 246 of the laminated substrate 240, and is output from the main terminal 224 of the U terminal.

Moreover, an intermediate voltage from the external power supply is applied from the main terminal 223, which is the M terminal, to the anode electrode of the diode 256 via the circuit layer 231e and conductive post 233e of the printed circuit board 230.

The drain electrode of the semiconductor element 257 is electrically connected to the cathode terminal of the diode 256 via the circuit board 244 of the laminated substrate 240. Furthermore, the main terminal 224 which is the U terminal of the circuit board 246 of the laminated substrate 240 is electrically connected to the source electrode of the semiconductor element 257 via the circuit board 246 of the laminated substrate 240, the conductive post 231i, the circuit layer 231g of the printed circuit board 230, and the conductive post 233g.

Therefore, once the semiconductor element 251 (T1) is turned off, the output current commutates to the semiconductor element 257 (T4) in an on-state, and is output from the source electrode on the front surface of the semiconductor element 257.

The current output from the source electrode of the semiconductor element 257 (T4) flows into the circuit layer 231g of the printed circuit board 230 via the conductive post 233g connected to the source electrode. Further, the output current further flows from the conductive post 231i into the circuit board 246 of the laminated substrate 240, and is output from the main terminal 224 of the U terminal.

Moreover, a load is applied to the anode electrode of the diode 258 from the main terminal 224, which is the U terminal, via the circuit board 246 of the laminated substrate 240, the conductive post 231i, the circuit layer 231g of the printed circuit board 230, and the conductive post 233g.

The drain electrode of the semiconductor element 255 is electrically connected to the cathode electrode of the diode 258 via the circuit board 244 of the laminated substrate 240. Furthermore, the main terminal 223, which is the M terminal, is electrically connected to the source electrode of the semiconductor element 255 via the conductive post 233e and the circuit layer 231e of the printed circuit board 230.

Then, when the inverter outputs a voltage having the negative polarity, once the semiconductor element 253 (T2) is turned on, then a current is output from the source electrode on the front surface of the semiconductor element 253.

The current output from the source electrode of the semiconductor element 253 (T2) flows into the circuit layer 231c of the printed circuit board 230 via the conductive post 233c connected to the source electrode, and is output from the main terminal 222 of the N terminal.

Moreover, a load is connected to the drain electrode of the semiconductor element 255 (T3) from the main terminal 224, which is the U terminal, via the circuit board 246 and conductive post 231i of the laminated substrate 240, and the diode 258 on the circuit board 244 of the laminated substrate 240. Then, once the semiconductor element 253 (T2) is turned off, an output current commutates to the semiconductor element 255 (T3) in an on-state.

The current output from the source electrode of the semiconductor element 255 (T3) flows into circuit layer 231e of the printed circuit board 230 via the conductive post 233e connected to the source electrode, and is output from the main terminal 223 of the M terminal.

The semiconductor unit 200 may efficiently convert a DC power input from the external power supply into an AC power by appropriately controlling the above-described each operation.

In this manner, in the semiconductor unit 200, the main terminals 221, 222, and 223, which are the P terminal, N terminal, and M terminal, respectively, receiving a signal from the outside are arranged in the center part. Moreover, the main terminal 224, which is the U terminal, for outputting a signal to the outside is arranged on the outer side. In the semiconductor unit 200, the current input to and output from the main terminals 221, 222, and 223 arranged in the center part flows from the center part of the semiconductor unit 200 to the outer side via the printed circuit board 230, the laminated substrate 240, the semiconductor elements 251, 253, 255, and 257, the diodes 252, 254, 256, and 258, and the like, and further flows from the outer side to the center part. Because the flow of such current in the semiconductor unit 200 allows to increase the areas where the current flows in the mutually opposite directions between the printed circuit board 230 and the laminated substrate 240, the inductance generated inside the semiconductor unit 200 may be cancelled out. Therefore, the inductance generated in the semiconductor unit 200 may be suppressed.

Note that, in the semiconductor device 100, the semiconductor unit 200 of a different type from the above-described semiconductor unit 200 is also used. Hereinafter, such a semiconductor unit 200 will be described using FIG. 10.

Figure 10:
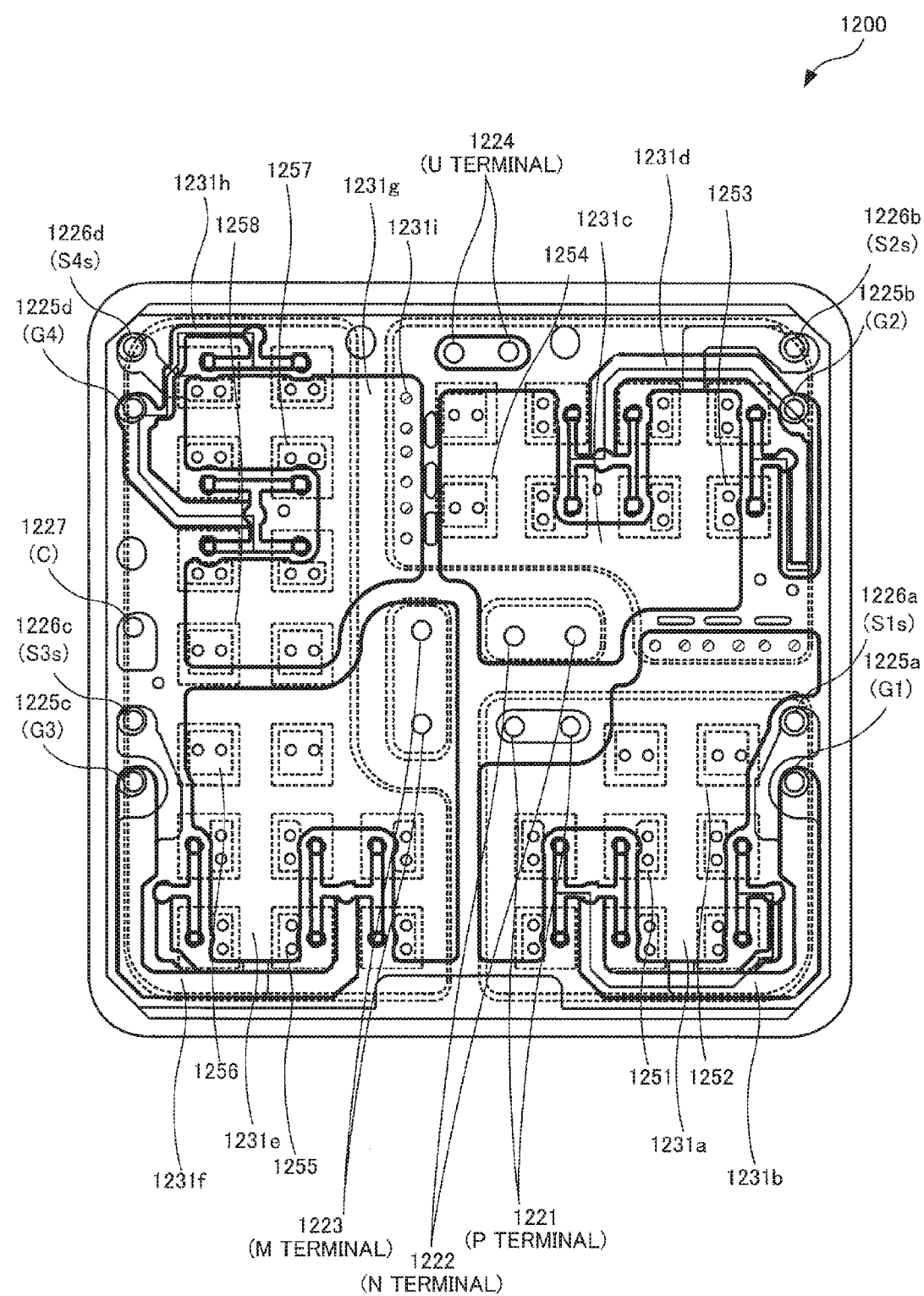
FIG. 10 illustrates the connection positions of conductive posts relative to the laminated substrate of the semiconductor unit of the semiconductor device in the embodiment (part 2).

FIG. 10 illustrates the connection positions of the conductive posts relative to the laminated substrate of the semiconductor unit of the semiconductor device in an embodiment.

The semiconductor unit 200 of a different type from the above-described semiconductor unit 200 is obtained by inverting the configurations of the printed circuit board 230 and laminated substrate 240 in the semiconductor unit 200 illustrated in FIGS. 5 to 9, respectively, as illustrated in FIG. 10.

Such a semiconductor unit 1200 illustrated in FIG. 10 is obtained just by inverting the configurations of the printed circuit board 230 and laminated substrate 240, in the semiconductor unit 200 illustrated in FIGS. 5 to 9, respectively, and therefore has the same configuration and function as the semiconductor unit 200 illustrated in FIGS. 5 to 9.

Therefore, in the semiconductor device 100, as illustrated in FIG. 2A, in the semiconductor units 200a and 200b on the metal base 110, the semiconductor unit 200 illustrated in FIGS. 5 to 9 is used, while in the semiconductor units 200c and 200d, a semiconductor unit 1200 illustrated in FIG. 10 is used.

Next, the circuit layer included in the first connecting unit 300 of the semiconductor device 100 will be described using FIGS. 11 to 14.

FIGS. 11 to 14 illustrate the circuit layer of the first connecting unit of the semiconductor device in the embodiment.

Note that, in FIGS. 11 to 14, the holes which the main terminals 221 to 224 and main terminals 1221 to 1224 penetrate are expressed with solid-line circles (however, the reference signs thereof are omitted). Moreover, in FIGS. 11 to 14, the portions where the control terminals 225a to 225d and control terminals 1225a to 1225d, the control terminals 226a to 226d and control terminals 1226a to 1226d, and the control terminal 227 and control terminal 1227 are fitted and the portions where the external control terminals 321 to 328 are electrically connected to penetrate are expressed with the dashed circles (or ellipses).

The first connecting unit 300 is arranged above the four semiconductor units 200a to 200d as illustrated in FIG. 2B. Then, the main terminals 221 to 224 and main terminals 1221 to 1224 of each of the semiconductor units 200a to 200d penetrate the first connecting unit 300 while being electrically insulated therefrom. Then, in the first connecting unit 300, the control terminals 225a to 225d and control terminals 1225a to 1225d, the control terminals 226a to 226d and control terminals 1226a to 1226d, and the control terminal 227 and control terminal 1227 of each of the semiconductor units 200a to 200d are fitted to the predetermined portions and electrically connected thereto, respectively. Furthermore, the first connecting unit 300 includes the external control terminals 321 to 328 that are electrically connected to the control terminals 225a to 225d and control terminals 1225a to 1225d, the control terminals 226a to 226d and control terminals 1226a to 1226d, and the control terminal 227 and control terminal 1227.

In such a first connecting unit 300, the circuit layers 330 to 360 illustrated in FIGS. 11 to 14 are sequentially stacked with an insulating layer (illustration is omitted) interposed therebetween. Here, an insulating film (illustration is omitted) with an opening needed for terminal connection is arranged also in both the top layer and bottom layer of the stacked circuit layers 330 to 360.

Figure 11:
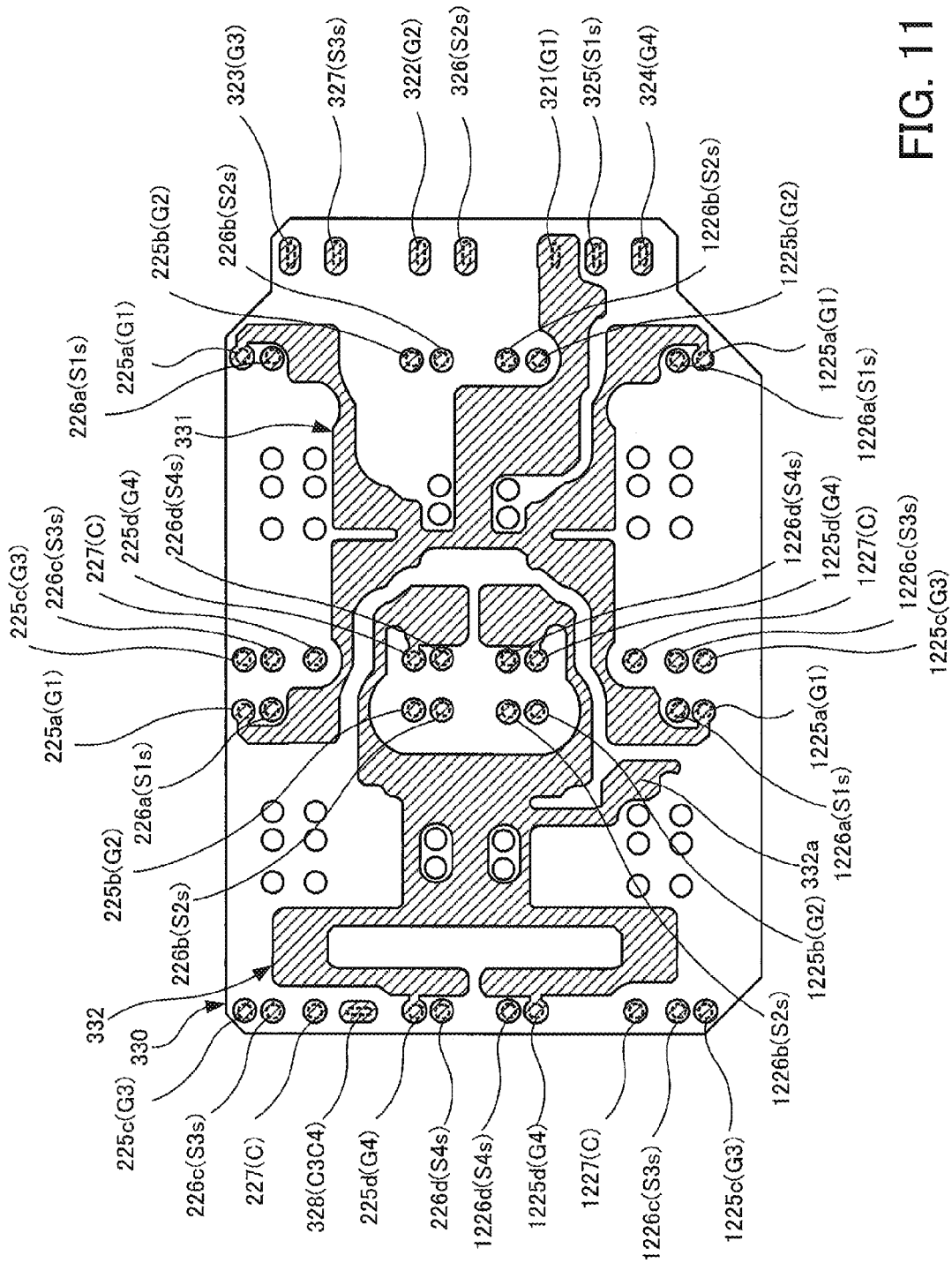
FIG. 11 illustrates a circuit layer of a first connecting unit of the semiconductor device in the embodiment (part 1).

The circuit layer 330 includes wiring layers 331 and 332 as illustrated in FIG. 11.

The wring layer 331 electrically connects the control terminal 225a (G1) and control terminal 1225a (G1) of each of the semiconductor units 200a to 200d to the external control terminal 321 (G1).

The wring layer 332 electrically connects between the control terminal 225d (G4) and control terminal 1225d (G4) of each of the semiconductor units 200a to 200d. Moreover, a connection portion 332a is provided in the wiring layer 332.

Figure 12:
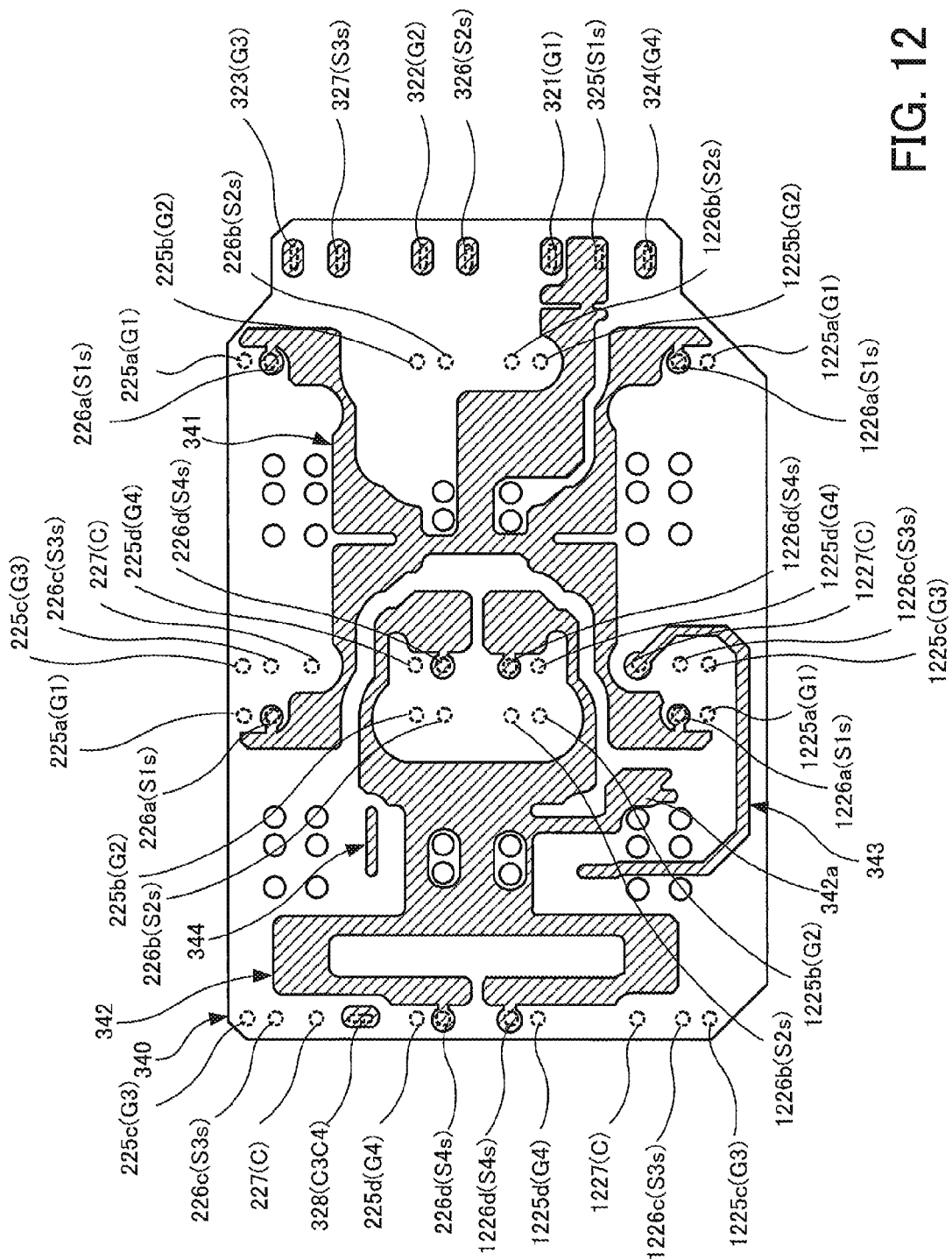
FIG. 12 illustrates the circuit layer of the first connecting unit of the semiconductor device in the embodiment (part 2).

The circuit layer 340 includes wiring layers 341 to 344 as illustrated in FIG. 12.

The wiring layer 341 electrically connects the control terminal 226a (S1s) and control terminal 1226a (S1s) of each of the semiconductor units 200a to 200d to an external control terminal 325 (S1s).

The wring layer 342 electrically connects between the control terminal 226d (G4s) and control terminal 1226d (G4s) of each of the semiconductor units 200a to 200d. Moreover, a connection portion 342a is provided in the wiring layer 342.

The wiring layer 343 is electrically connected to the control terminal 227 (C) and control terminal 1227 (C).

Figure 13:
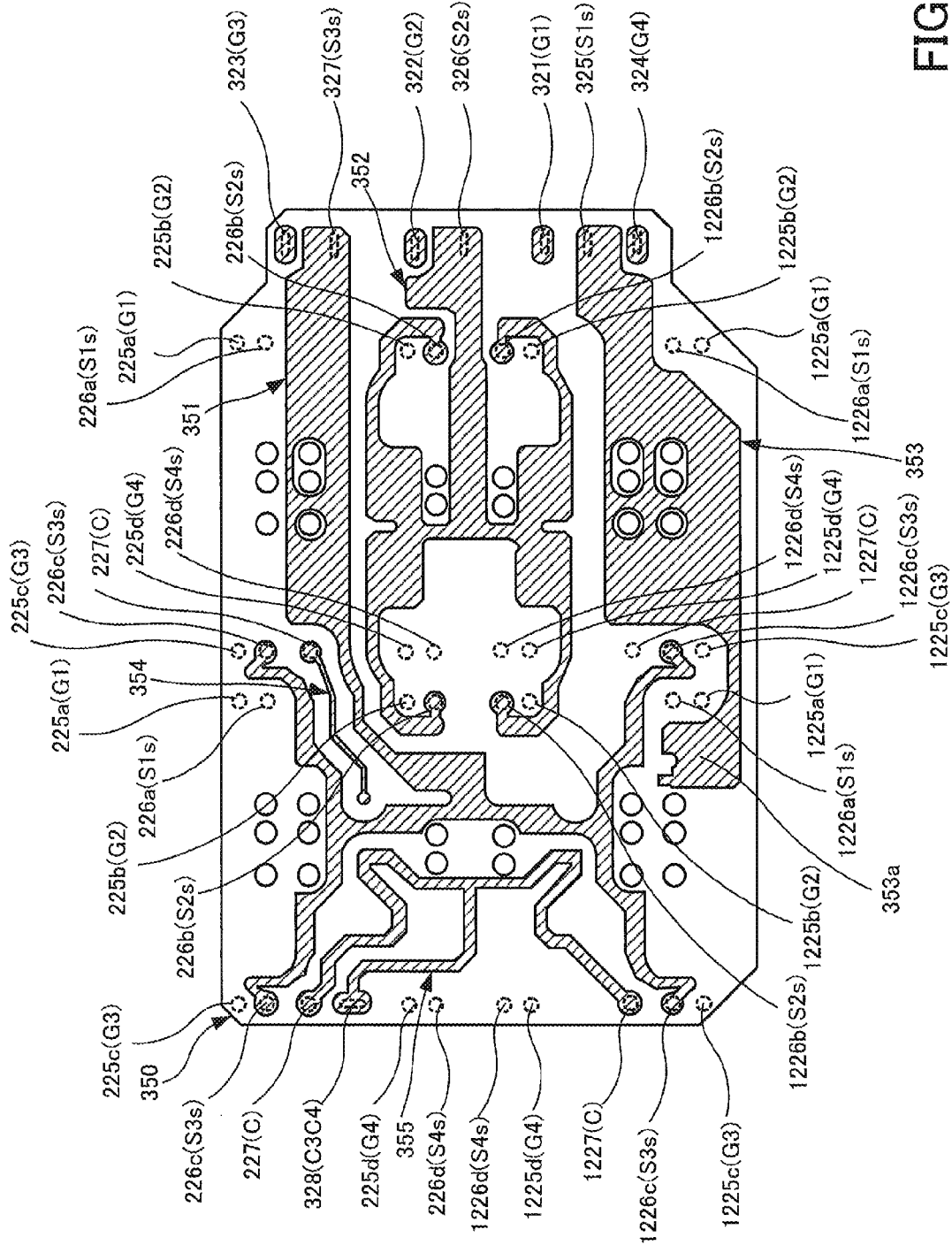
FIG. 13 illustrates the circuit layer of the first connecting unit of the semiconductor device in the embodiment (part 3).

The circuit layer 350 includes wiring layers 351 to 355 as illustrated in FIG. 13.

The wiring layer 351 electrically connects the control terminal 226c (S3s) and control terminal 1226c (S3s) of each of the semiconductor units 200a to 200d to an external control terminal 327 (S3s).

The wiring layer 352 electrically connects the control terminal 226b (S2s) and control terminal 1226b (S2s) of each of the semiconductor units 200a to 200d to an external control terminal 326 (S2s).

The wring layer 353 is electrically connected to the external control terminal 325 (S1s). Moreover, a connection portion 353a is provided in the wiring layer 353.

The wiring layer 354 is electrically connected to the control terminal 227 (C) and control terminal 1227 (C) of each of the semiconductor units 200a to 200d.

The wiring layer 355 electrically connects the control terminal 227 (C) and control terminal 1227 (C) of each of the semiconductor units 200a to 200d to an external control terminal 328 (C3C4).

Figure 14:
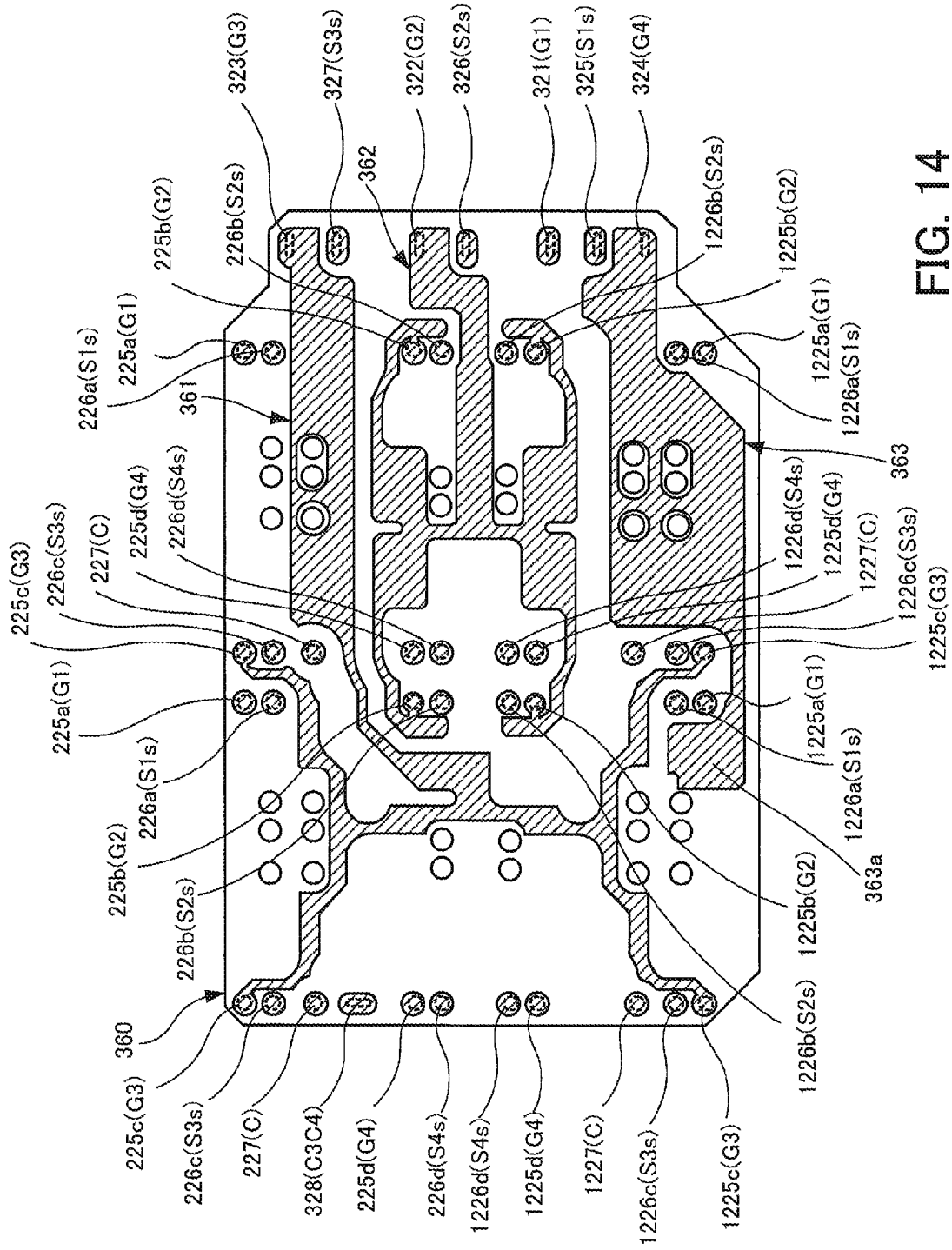
FIG. 14 illustrates the circuit layer of the first connecting unit of the semiconductor device in the embodiment (part 4).

The circuit layer 360 includes wiring layers 361 to 363 as illustrated in FIG. 14.

The wiring layer 361 electrically connects between the control terminal 225c (G3) and control terminal 1225c (G3) of each of the semiconductor units 200a to 200d and an external control terminal 323 (G3).

The wiring layer 362 electrically connects between the control terminal 225b (G2) and control terminal 1225b (G2) of each of the semiconductor units 200a to 200d and an external control terminal 322 (G2).

The wiring layer 363 is electrically connected to an external control terminal 324 (G4). Moreover, a connection portion 363a is provided in the wiring layer 363.

Wiring of the external control terminals 321 to 328 in the first connecting unit 300 provided with such circuit layers 330 to 360 will be described.

The external control terminal 321 (G1) is wired to the control terminal 225a (G1) and control terminal 1225a (G1) of each of the semiconductor units 200a to 200d via the wiring layer 331 (FIG. 11) of the circuit layer 330.

The external control terminal 322 (G2) is wired to the control terminal 225b (G2) and control terminal 1225b (G2) of each of the semiconductor units 200a to 200d via the wiring layer 352 (FIG. 13) of the circuit layer 350.

The external control terminal 323 (G3) is wired to the control terminal 225c (G3) and control terminal 1225c (G3) of each of the semiconductor units 200a to 200d via the wiring layer 361 (FIG. 14) of the circuit layer 360.

The external control terminal 324 (G4) is wired to the control terminal 225d (G4) and control terminal 1225d (G4) of each of the semiconductor units 200a to 200d, via a connection portion 322a (FIG. 11) of the wiring layer 332 of the circuit layer 330, and the connection portion 342a (FIG. 12) of the wiring layer 342 of the circuit layer 340, the connection portion 353a (FIG. 13) of the wiring layer 353 of the circuit layer 350, and the connection portion 363a (FIG. 14) of the wiring layer 363 of the circuit layer 360, these connection portions being electrically connected.

The external control terminal 325 (S1s) is wired to the control terminal 226a (S1s) and control terminal 1226a (S1s) of each of the semiconductor units 200a to 200d via the wiring layer 341 (FIG. 12) of the circuit layer 340.

The external control terminal 326 (S2s) is wired to the control terminal 226b (S2s) and control terminal 1226b (S2s) of each of the semiconductor units 200a to 200d via the wiring layer 352 (FIG. 13) of the circuit layer 350.

The external control terminal 327 (S3s) is wired to the control terminal 226c (S3s) and control terminal 1226c (S3s) of each of the semiconductor units 200a to 200d via the wiring layer 351 (FIG. 13) of the circuit layer 350.

The external control terminal 328 (C3C4) is wired to the control terminal 227 (C) and control terminal 1227 (C) of each of the semiconductor units 200a to 200d as described below. First, the wiring layer 354 (FIG. 13) of the circuit layer 350 is electrically connected to the wiring layer 355 (FIG. 13) of the circuit layer 350 via the wiring layer 344 (FIG. 12) of the circuit layer 340. Furthermore, the wiring layer 343 (FIG. 12) of the circuit layer 340 is electrically connected to the wiring layer 355 (FIG. 13) of the circuit layer 350. In this manner, the external control terminal 328 (C3C4) is wired to the control terminal 227 (C) and control terminal 1227 (C) of each of the semiconductor units 200a to 200d via the wiring layers 343, 344 (FIG. 12) of the circuit layer 340 and the wiring layers 354, 355 (FIG. 13) of the circuit layer 350.

The first connecting unit 300 includes such circuit layers 330 to 360 so as to be able to electrically connect the control terminals 225a to 225d and control terminals 1225a to 1225d, the control terminals 226a to 226d and control terminals 1226a to 1226d, and the control terminal 227 and control terminal 1227 of each of the semiconductor units 200a to 200d to the external control terminals 321 to 328, respectively.

Moreover, although such a first connecting unit 300 includes a plurality of control terminals 225a to 225d and control terminals 1225a to 1225d, control terminals 226a to 226d and control terminals 1226a to 1226d, and control terminal 227 and control terminal 1227, it does not allow such a high current like in the second connecting unit 400 described later to flow. Therefore, in the first connecting unit 300, the thickness of each wiring layer in the circuit layers 330 to 360 does not need to be increased and multilayer wiring may be also adopted.

Next, the circuit board included in the second connecting unit 400 of the semiconductor device 100 will be described using FIGS. 15 and 16.

Figure 15:
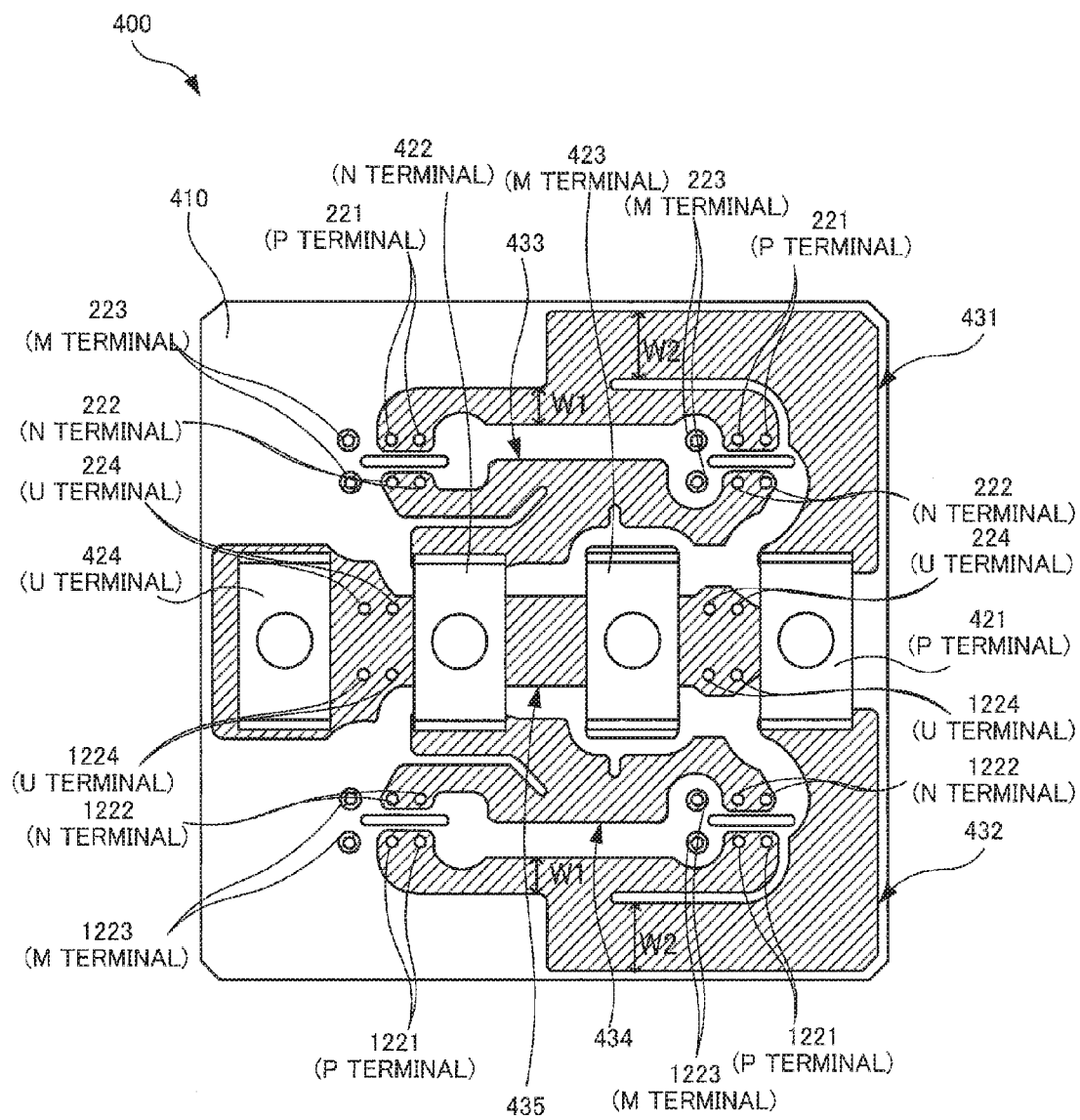
FIG. 15 illustrates a circuit board on the front surface of a second connecting unit of the semiconductor device in the embodiment.

FIG. 15 illustrates the circuit board on the front surface of the second connecting unit of the semiconductor device in the embodiment.

Figure 16:
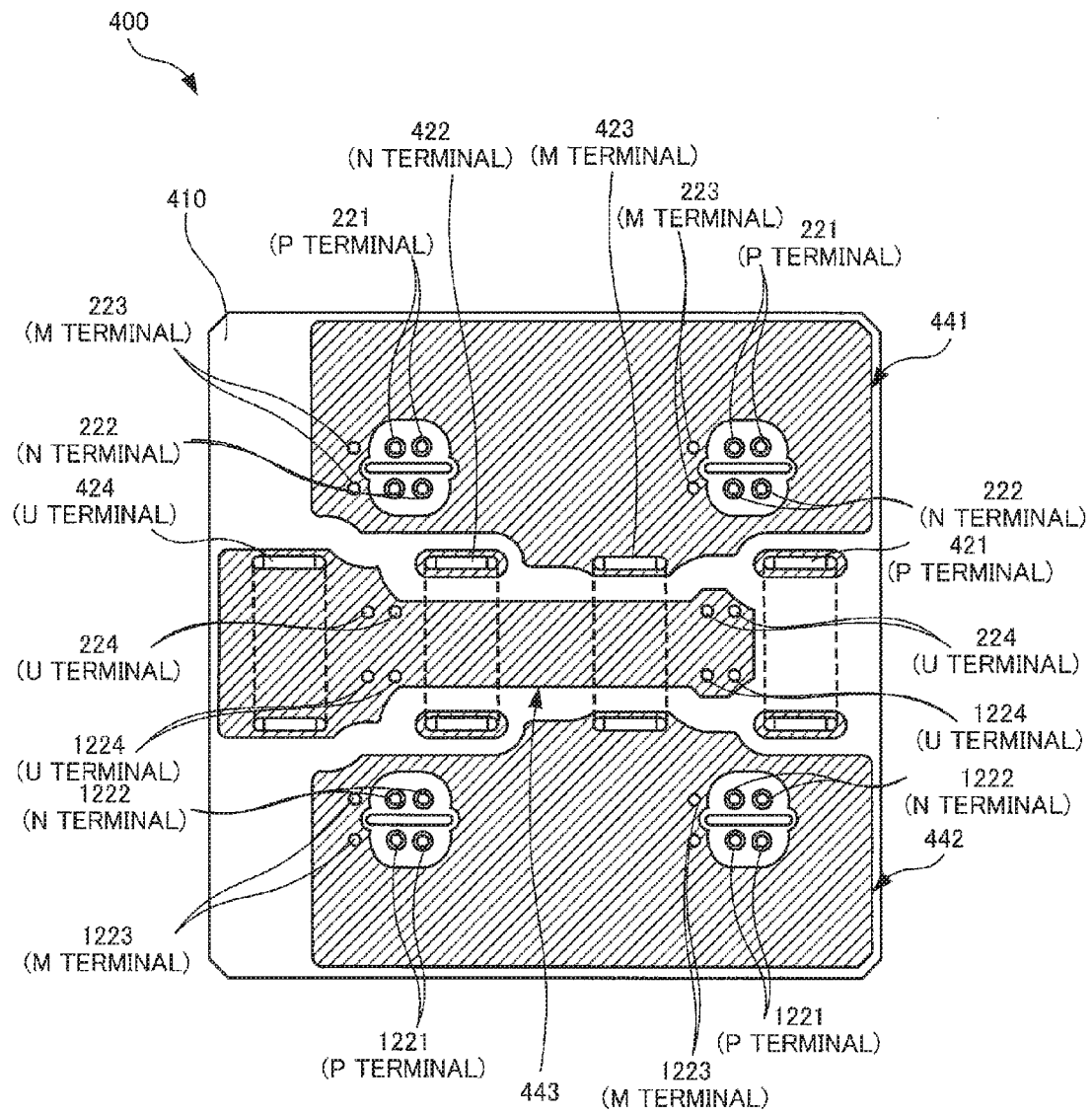
FIG. 16 illustrates a circuit board on the rear surface of the second connecting unit of the semiconductor device in the embodiment.

FIG. 16 illustrates the circuit board on the rear surface of the second connecting unit of the semiconductor device in the embodiment. Note that FIG. 16 illustrates the circuit board on the rear surface when the second connecting unit is seen from the front surface side.

The second connecting unit 400 is arranged above the first connecting unit 300 as illustrated in FIG. 3A. Here, the main terminals 221 to 224 and main terminals 1221 to 1224 of each of the semiconductor units 200a to 200d, these main terminals penetrating the first connecting unit 300, are fitted and electrically connected.

In such a second connecting unit 400, first, as illustrated in FIG. 15, the external terminals 421 to 424 are attached to the front surface of the insulating board 410. The second connecting unit 400 further includes first wiring plates 431 to 435.

The first wiring plates 431 and 432 are line symmetric, with the external terminals 421 to 424 arranged in the insulating board 410 as the center line. In other words, the first wiring plates 431 and 432 are arranged symmetrically with respect to a center line passing through a center of all of the terminals 421, 422, and 423. The end portions of the external terminal 421 (P terminal) are electrically connected to the first wiring plates 431 and 432, respectively. Thus, the main terminal 221 and main terminal 1221 (P terminals) of each of the semiconductor units 200a to 200d are electrically connected to the external terminal 421 (P terminal) via the first wiring plates 431 and 432.

The first wiring plates 433 and 434 are line symmetric, with the external terminals 421 to 424 arranged in the insulating board 410 as the center line. The end portions of the external terminal 422 (N terminal) are electrically connected to the first wiring plates 433 and 434, respectively. Thus, the main terminal 222 and main terminal 1222 (N terminals) of each of the semiconductor units 200a to 200d are electrically connected to the external terminal 422 (N terminal) via the first wiring plates 433 and 434.

The first wiring plate 435 is line symmetric, with the external terminals 421 to 424 arranged in the insulating board 410 as the center line. The end portion of the external terminal 424 (U terminal) is electrically connected to the first wiring plate 435. Thus, the main terminal 224 and main terminal 1224 (U terminals) of each of the semiconductor units 200a to 200d are electrically connected to the external terminal 424 (U terminal) via the first wiring plate 435.

Moreover, in the second connecting unit 400, as illustrated in FIG. 16, each end portion of the external terminals 421 to 424 attached to the front surface penetrates the rear surface of the insulating board 410. The second connecting unit 400 includes second wiring plates 441 to 443.

The second wiring plates 441 and 442 are line symmetric, with the external terminals 421 to 424 arranged in the insulating board 410 as the center line. The end portions of the external terminal 423 (M terminal) are electrically connected to the second wiring plates 441 and 442, respectively. Thus, the main terminal 223 and main terminal 1223 (M terminals) of each of the semiconductor units 200a to 200d are electrically connected to the external terminal 423 (M terminal) via the second wiring plates 441 and 442.

The second wiring plate 443 has the substantially same shape as the first wiring plate 435, and is formed in the insulating board 410 on the rear surface of the first wiring plate 435. Therefore, the second wiring plate 443 is also line symmetric, as with the first wiring plate 435, with the external terminals 421 to 424 of the insulating board 410 as the center line. The end portion of the external terminal 424 (U terminal) is electrically connected to the second wiring plate 443. Thus, the main terminal 224 and main terminal 1224 (U terminals) of each of the semiconductor units 200a to 200d are electrically connected to the external terminal 424 (U terminal) via the second wiring plate 443.

Wiring between the main terminals 221 to 224 and main terminals 1221 to 1224 in the second connecting unit 400, which includes such first wiring plates 431 to 435 on the front surface and such second wiring plates 441 to 443 on the rear surface, and the external terminals 421 to 424 will be described.

The external terminal 421 (P terminal) is wired to the main terminal 221 and main terminal 1221 (P terminals) of each of the semiconductor units 200a to 200d via the first wiring plates 431 and 432 (FIG. 15).

Moreover, in this case, a width W2 of the first wiring plate 431 is approximately twice a width W1 thereof. This is because the currents input from both the main terminal 221 and the main terminal 1221 flow through a portion of the first wiring plate 431, the portion having the width W1, from the right and left directions, respectively and merge and proceed through a portion of the first wiring plate 431, the portion having the width W2, to the external terminal 421. In this case, if the width W1 is the same as the width W2, the heat generation caused by the merged current flowing through the portion having the width W2 will increase. In order to prevent a local increase in temperature by uniformly generating heat inside the first wiring plate 431, the width W2 of the first wiring plate 431 is preferably approximately twice the width W1. The same is applied also to the first wiring plate 432.

Moreover, the shapes of the first wiring plates 431 and 432 are line symmetric to each other, and the length of the wiring to the main terminal 221 (P terminal) from the external terminal 421 (P terminal) and the length of the wiring to the main terminal 1221 (P terminal) from the external terminal 421 (P terminal) are set equal. This is because the equal-length wiring allows not only the electric resistance from the external terminal to each of the semiconductor units 200a to 200d to become equal but the inductance from the external terminal to each of the semiconductor units 200a to 200d to become nearly equal, so that the current will be uniformly distributed to all the semiconductor units 200a to 200d. While the lengths of the wirings of the external terminals to the main terminal 421 is described as being equal for all of the main terminals, embodiments encompass minor variations in length, such as of 10% or less, which may be described as being substantially equal.

The external terminal 422 (N terminal) is wired to the main terminal 222 and main terminal 1222 (N terminals) of each of the semiconductor units 200a to 200d via the first wiring plates 433 and 434 (FIG. 15).

Moreover, the shapes of the first wiring plates 433 and 434 are line symmetric to each other, and the length of the wiring to the external terminal 222 (N terminal) from the external terminal 422 (N terminal) and the length of the wiring to the main terminal 1222 (N terminal) from the external terminal 422 (N terminal) are set equal.

The external terminal 423 (M terminal) is wired to the main terminal 223 and main terminal 1223 (M terminals) of each of the semiconductor units 200a to 200d via the second wiring plates 441 and 442 (FIG. 16).

Such second wiring plates 441, 442 substantially overlap with the first wiring plates 431, 433 and first wiring plates 432, 434 on the front surface of the insulating board 410. This allows the mutual inductance caused by the current flowing through the first wiring plates 431 to 434 and the current flowing through the second wiring plates 441, 442 to be reduced.

The external terminal 424 (U terminal) is wired to the main terminal 224 and main terminal 1224 (U terminals) of each of the semiconductor units 200a to 200d via the first wiring plate 435 (FIG. 15) and the second wiring plate 443 (FIG. 16).

As described above, the first wiring plate 435 on the front surface of the insulating board 410 and the second wiring plates 443 on the rear surface having the same shape as the first wiring plate 435 overlap with each other to be conducted to the external terminal 424. As a result, the currents output from the main terminal 224 and main terminal 1224 flow through both the first wiring plate 435 and the second wiring plate 443, and thus the heat generated in the first wiring plate 435 and second wiring plate 443 may be reduced.

Because the second connecting unit 400 includes such first wiring plates 431 to 435 and second wiring plates 441 to 443, the main terminals 221 to 224 and main terminals 1221 to 1224 of each of the semiconductor units 200a to 200d may be electrically connected to the external terminals 421 to 424. Moreover, in such a second connecting unit 400, the shapes and arrangements of the first wiring plates 431, 432, first wiring plates 433, 434, and second wiring plates 441, 442 are line symmetric, respectively. Therefore, the wiring to each of the semiconductor units 200a to 200d may be made symmetric and shorter. Therefore, the inductances generated in the first wiring plates 431, 432, the first wiring plates 433, 434, and the second wiring plates 441, 442 may be reduced.

Moreover, because in the second connecting unit 400, the shapes and arrangements of the first wiring plates 431, 432, first wiring plates 433, 434, and second wiring plates 441, 442 are line symmetric, respectively, an inverted-U-shaped one may be used as the external terminals 421 to 424. Such external terminals 421 to 424 may reduce the inductance because these external terminals may distribute the current into two directions.

Note that, in the second connecting unit 400, a case has been described where the first wiring plates 431 to 435 are provided on the front surface of the insulating board 410 and the second wiring plates 441 to 443 are provided on the rear surface. The second connecting unit 400 may be formed from a printed circuit board or the like, for example. Furthermore, not limited to this case, the main terminals 221 to 224 and main terminals 1221 to 1224 may be connected using a lead frame, a bus bar, or the like.

With the disclosed technique, the inductance of a wiring may be reduced while increasing the rated current.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor device comprising:
    a plurality of semiconductor units; and
    a connecting device which electrically connects the semiconductor units in parallel,
    wherein each of the semiconductor units includes:
        a laminated substrate which has an insulating board and a circuit board arranged on a front surface of the insulating board;
        a plurality of semiconductor elements each having a rear surface fixed to the circuit board and a front surface having a main electrode and a control electrode;
        a wiring member electrically connected to the main electrode and the control electrode of the semiconductor element;
        a control terminal electrically connected to the control electrode of the semiconductor element via the wiring member; and
        a main terminal electrically connected to the main electrode of the semiconductor element via the wiring member,
    wherein, inside each respective semiconductor unit, the laminated substrate, the semiconductor element, and the wiring member constitute a respective three-level inverter circuit, and
    wherein the connecting device includes:
        a first connecting unit electrically connected to the control terminal of each of the plurality of semiconductor units, and
        a second connecting unit electrically connected to the main terminals of each of the plurality of semiconductor units.

2. The semiconductor device according to claim 1, wherein the wiring member of each semiconductor unit includes:
    a printed circuit board arranged facing a principal surface of the insulating board of the laminated substrate, and
    a plurality of conductive posts which electrically connects the printed circuit board and the semiconductor elements.

3. The semiconductor device according to claim 2, wherein the main terminal of each semiconductor unit includes a P terminal, an N terminal, an M terminal, and a U terminal, and
    wherein at least the P terminal, the N terminal and the M terminal among the main terminals are provided in a center part of the respective semiconductor unit.

4. The semiconductor device according to claim 1, wherein the second connecting unit is stacked on the first connecting unit of the connecting device.

5. The semiconductor device according to claim 4, wherein the main terminal of each of the semiconductor units penetrates the first connecting unit, and
    wherein the second connecting unit is stacked on the first connecting unit and is electrically connected to the main terminal of each of the semiconductor units penetrating through the first connecting unit.

6. The semiconductor device according to claim 1, wherein a wiring of the second connecting unit is configured such that a length from the main terminal of each of the semiconductor units to a single U terminal of the second connecting unit is substantially equal.

7. The semiconductor device according to claim 1, wherein a wiring of the second connecting unit is configured such that a length from the main terminal of each of the semiconductor units to a single U terminal of the second connecting unit has a nearly equal inductance.

8. The semiconductor device according to claim 1, wherein the second connecting unit includes a first wiring plate and a second wiring plate.

9. The semiconductor device according to claim 8, the first wiring plate is symmetrical with respect to a center line of the first wiring plate.

10. The semiconductor device according to claim 8,
    wherein the second connecting unit includes an external terminal that is electrically connected to the first wiring plate or the second wiring plate and to the main terminal of each of the plurality of semiconductor units via the first wiring plate or second wiring plate, and
    wherein the external terminal is located in a vicinity of a center part of the second connecting unit.

11. The semiconductor device according to claim 1, wherein the second connecting unit includes an insulating board, a first wiring plate arranged on a front surface of the insulating board, and a second wiring plate arranged on a rear surface of the insulating board.

12. The semiconductor device according to claim 11,
the second wiring plate is arranged on the rear surface of the insulating board so as to overlap with the first wiring plate.

13. The semiconductor device according to claim 12, wherein the main terminal is arranged outside the external terminal.

\* \* \* \* \*